United States Patent
Adachi et al.

(10) Patent No.: US 7,671,516 B2
(45) Date of Patent: Mar. 2, 2010

(54) ULTRASONIC ACTUATOR

(75) Inventors: Yusuke Adachi, Osaka (JP); Hiroshi Fukushima, Osaka (JP)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 11/914,158

(22) PCT Filed: Dec. 5, 2006

(86) PCT No.: PCT/JP2006/324211

§ 371 (c)(1),
(2), (4) Date: Nov. 12, 2007

(87) PCT Pub. No.: WO2007/066633

PCT Pub. Date: Jun. 14, 2007

(65) Prior Publication Data

US 2009/0072665 A1    Mar. 19, 2009

(30) Foreign Application Priority Data

Dec. 5, 2005 (JP) .............................. 2005-350355
Dec. 5, 2005 (JP) .............................. 2005-350356
Dec. 5, 2005 (JP) .............................. 2005-350357

(51) Int. Cl.
*H01L 41/053* (2006.01)
*H02N 2/00* (2006.01)
*H01R 13/40* (2006.01)

(52) U.S. Cl. ................... 310/348; 310/323.01; 439/586

(58) Field of Classification Search ............... 310/317, 310/323.01, 323.02, 328, 348; 439/586, 439/588
See application file for complete search history.

(56) References Cited

U.S. PATENT DOCUMENTS

| 4,492,892 A | * | 1/1985 | Nakatani | 310/345 |
| 4,513,219 A | | 4/1985 | Katsuma et al. | |
| 5,453,653 A | * | 9/1995 | Zumeris | 310/323.16 |
| 6,700,306 B2 | * | 3/2004 | Nakamura et al. | 310/328 |
| 6,897,598 B2 | * | 5/2005 | Kato et al. | 310/323.02 |
| 2008/0057798 A1 | * | 3/2008 | Florian et al. | 439/839 |
| 2008/0218026 A1 | * | 9/2008 | Pletner et al. | 310/314 |
| 2008/0278033 A1 | * | 11/2008 | Adachi et al. | 310/317 |
| 2009/0015099 A1 | * | 1/2009 | Mukae | 310/323.01 |
| 2009/0021113 A1 | * | 1/2009 | Negishi et al. | 310/323.02 |

FOREIGN PATENT DOCUMENTS

| JP | 59-096883 | | 6/1984 |
| JP | 01-321874 | | 12/1989 |
| JP | 07-184382 | | 7/1995 |
| JP | 07-274549 | | 10/1995 |
| JP | 08-237971 | | 9/1996 |
| JP | 10-074992 | * | 3/1998 |
| JP | 11-069851 | | 3/1999 |
| JP | 11-146667 | * | 5/1999 |
| JP | 11-346486 | | 12/1999 |
| JP | 2002-359984 | * | 12/2002 |

* cited by examiner

*Primary Examiner*—Thomas M Dougherty
(74) *Attorney, Agent, or Firm*—McDermott Will & Emery LLP

(57) ABSTRACT

An ultrasonic actuator includes: a piezoelectric element 10 for generating various kinds of vibrations having different vibration directions; a driver element provided on the piezoelectric element 10 and actuated in accordance with the vibration of the piezoelectric element 10 to output driving force toward a certain driving direction; feeding electrodes 8 provided on the piezoelectric element 10 and electrically connected to the piezoelectric element 10; and feeding-supporting parts 6A, 6B, 7A, 7B and 9A abutting the feeding electrodes to elastically support the actuator body and serving as feeding terminals for supplying a voltage to the feeding electrodes 8.

21 Claims, 25 Drawing Sheets

ULTRASONIC ACTUATOR

RELATED APPLICATIONS

This application is the U.S. National Phase under 35 U.S.C. § 371 of International Application No. PCT/JP2006/324211, filed on Dec. 5, 2006, which in turn claims the benefit of Japanese Application No. 2005-350355, filed on Dec. 5, 2005, Japanese Application No. 2005-350356, filed on Dec. 5, 2005, and Japanese Application No. 2005-350357, filed on Dec. 5, 2005 the disclosures of which Applications are incorporated by reference herein.

TECHNICAL FIELD

The present invention relates to a vibration actuator used for various electronic devices. In particular, it relates to an ultrasonic actuator using an electromechanical transducer element.

BACKGROUND ART

A conventional ultrasonic actuator is shown in FIGS. 21 and 22. FIG. 21 is a perspective view of a piezoelectric element of the conventional ultrasonic actuator and FIG. 22 is a sectional view of the same.

A piezoelectric element 100 is supported by five supporting parts 101A, 101B, 101C, 101D and 101E. The piezoelectric element 100 includes four quadrant electrodes 102a, 102b, 102c and 102d provided on a surface of the piezoelectric element 100 and an overall electrode (not shown) formed to cover the entire area of an opposite surface of the piezoelectric element 100.

A wire 104a is connected to the electrode 102a by a solder 105a and to the electrode 102c by a solder 105c. A wire 104b is connected to the electrode 102b by a solder 105b and to the electrode 102d by a solder 105d. Further, a wire 104g is connected to the overall electrode. A voltage is applied to the piezoelectric element 100 through the wires 104a, 104b and 104g.

A driver element 102 is provided on the top surface of the piezoelectric element 100 and a head of the driver element 102 is in contact with a movable object 103. The head of the driver element 102 is pressed onto the movable object 103 by the supporting part 101C. As a result, friction between the head of the driver element 102 and the movable object 103 is increased such that the vibration of the piezoelectric element 100 is surely transmitted to the movable object 103 via the driver element 102.

Hereinafter, how to operate the ultrasonic actuator is briefly explained.

FIGS. 23, 24 and 25A to 25D are conceptual diagrams illustrating the vibration modes of the piezoelectric element.

With the wire 104g connected to ground, a sinusoidal reference voltage of a certain frequency is applied to the wire 104a and a voltage having a phase shifted by 90° or −90° relative to the reference voltage is applied to the wire 104b. Accordingly, the piezoelectric element 100 is induced to vibrate in a second-order mode of bending vibration shown in FIG. 23 and a first-order mode of stretching vibration (so-called longitudinal vibration; hereinafter may be referred to as longitudinal vibration) shown in FIG. 24.

Resonance frequencies of the bending and stretching vibrations are determined by the material and shape of the piezoelectric element 100. When the two resonance frequencies are set almost equal and a voltage having a frequency near the set frequency is applied, the piezoelectric element 100 is induced to vibrate in a second-order mode of bending vibration and a first-order mode of stretching vibration in a harmonious manner. Thus, the shape of the piezoelectric element 100 varies sequentially in the order shown in FIGS. 25A to 25D.

As a result, the driver element 102 provided on the piezoelectric element 100 makes an elliptical motion as viewed in the direction perpendicular to the page surface. That is, the bending and stretching vibrations of the piezoelectric element 100 are combined to cause the elliptical motion of the driver element 102. Due to the elliptical motion, the movable object 103 supported by the driver element 102 moves in the direction of an arrow A or B. Thus, the function of the ultrasonic actuator is achieved.

Now, a node of the vibration of the piezoelectric element will be explained.

As shown in FIG. 24, a node of the stretching vibration is the center of the piezoelectric element in the lengthwise direction. Further, as shown in FIG. 23, a node of the bending vibration is the center of the piezoelectric element in the lengthwise direction and parts of the piezoelectric element apart from the center by 35 to 40% of the length of the piezoelectric element, though which are displaced depending on the shape of the element.

Specifically, when the stretching and bending vibrations take place in a harmonious manner, a common node will only be the center of the piezoelectric element in the lengthwise direction.

As known prior art documents related to the invention of the present application, for example, we note Patent Literature 1: Japanese Unexamined Patent Publication No. H08-237971 and Patent Literature 2: Japanese Unexamined Patent Publication No. H11-69851.

DISCLOSURE OF THE INVENTION

Problem that the Invention is to Solve

In an ultrasonic actuator according to Patent Literature 1, feeding electrodes are provided on a surface of the piezoelectric element and wires are connected to the feeding electrodes by solders such that a voltage is applied to the feeding electrodes via the wires. According to this configuration, parts of the piezoelectric element on which the solders are provided are highly stressed and the piezoelectric element may possibly be cracked.

On the other hand, in an ultrasonic actuator according to Patent Literature 2, the voltage application to the feeding electrodes is performed without using the wires and the solders. As the piezoelectric element or the actuator body is surely fixed, the stretching vibration of the piezoelectric element or the actuator body is hindered. As a result, the efficiency of the ultrasonic actuator is decreased.

In view of the above, the present invention aims to reduce the adverse effect on the vibration of the piezoelectric element, improve the efficiency of the ultrasonic actuator and prevent the cracking of the piezoelectric element caused by the concentration of stress on part of the piezoelectric element on which the wires for feeding a voltage to the piezoelectric element are connected.

Means of Solving the Problem

The present invention provides an ultrasonic actuator including: an actuator body having a piezoelectric element and generating various kinds of vibrations having different vibration directions; a driver element provided on the actuator body and actuated in accordance with the vibration of the actuator body to output driving force toward a certain driving direction; feeding electrodes provided on the actuator body and electrically connected to the piezoelectric element; and feeding-supporting parts abutting the feeding electrodes to elastically support the actuator body and serving as feeding terminals for supplying a voltage to the feeding electrodes.

EFFECT OF THE INVENTION

According to the present invention, the hindrance to the vibration of the actuator body and the piezoelectric element is reduced because the feeding-supporting parts elastically support the actuator body including the piezoelectric element. As a result, the efficiency is improved. In addition, according to the present invention, the need of forming the solders on the piezoelectric element is eliminated because the feeding-supporting parts establish electrical conduction between the piezoelectric element and a power source. Therefore, the present invention effectively prevents the cracking of the piezoelectric element caused by the concentration of stress on part of the piezoelectric element on which the solders are provided.

EXPLANATION OF REFERENCE NUMERALS

Figure 1:
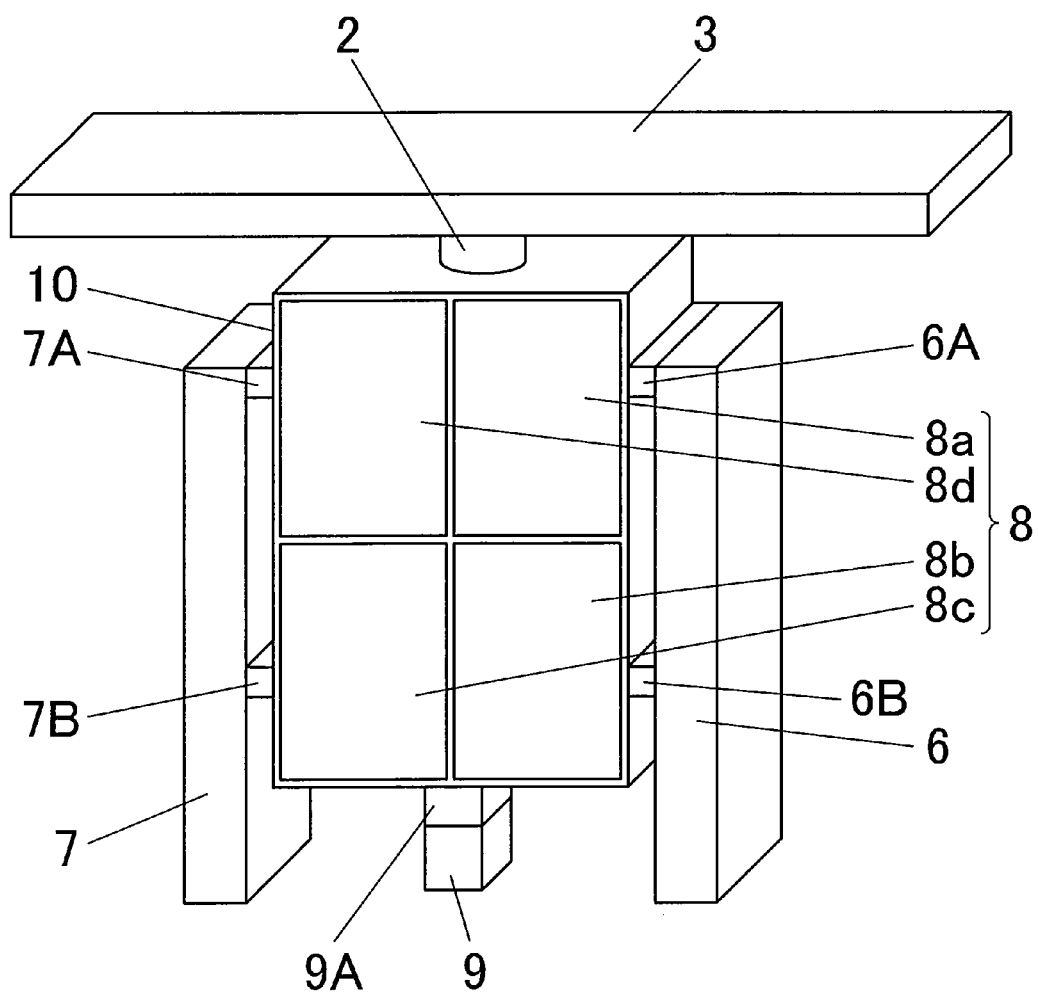
FIG. 1 is a perspective view of an ultrasonic actuator according to a first embodiment of the present invention.

1 Target device
2 Driver element
3 Movable object
4, 4a, 4b, 4g Wire
5 Solder
6, 52 First supporting member
6A, 6B, 52A Supporting part of first supporting member
7, 53 Second supporting member
7A, 7B, 53A Supporting part of second supporting member
8, 8a, 8b, 8c, 8d Feeding electrode
9, 54 Third supporting member
9A, 54A Supporting part of third supporting member
10, 61 Piezoelectric element
11, 81 Lead electrode
51, 82 Conductive part

BEST MODE FOR CARRYING OUT THE INVENTION

Hereinafter, an ultrasonic actuator of the present invention will be explained with reference to the embodiments and figures.

First Embodiment

A piezoelectric element 10 is supported by supporting parts 6A, 6B, 7A, 7B and 9A of first to third supporting members 6, 7 and 9 provided on a target device 1. The piezoelectric element 10 constitutes an actuator body.

The third supporting member 9 is provided on the target device 1 on which the ultrasonic actuator is mounted. When the ultrasonic actuator is mounted on the target device 1, the third supporting member 9 supports the piezoelectric element 10 from the bottom via the supporting part 9A and pressurizes a driver element 2 onto a movable object 3.

The supporting parts 6A, 6B, 7A, 7B and 9A are made of an elastic body. More specifically, they may be made of an elastomer, silicone rubber or a leaf spring.

In particular, when the silicone rubber is used, surface contact is established between the supporting members and the piezoelectric element 10 and between the supporting members and the supporting parts. Therefore, the piezoelectric element 10 is supported with stability. Further, as compared with other elastomers, elasticity of the silicon rubber is less likely to vary with temperature change and therefore stable support is achieved. In addition, the occurrence of noise caused by the vibration of the piezoelectric element 10 is prevented.

With use of the elastic body at least as the supporting parts, the hindrance to the vibration of the piezoelectric element 10 is reduced. As a result, the efficiency of the ultrasonic actuator is improved. In particular, since the supporting part 9A of the third supporting member 9 supports the piezoelectric element 10 at part thereof other than the node of the piezoelectric element 10 (non-node part), use of the elastic body has great effect of reducing the hindrance to a stretching vibration.

The other supporting parts 6A, 6B, 7A and 7B of the first and second supporting members 6 and 7 support the nodes of a bending vibration. Since the supporting parts 6A, 6B, 7A and 7B are made of an elastic body, they are less likely to hinder the bending vibration as compared with the conventional supporting parts firmly secured on the piezoelectric element. Although the supporting parts 6A, 6B, 7A and 7B support the non-node parts of the stretching vibration, they are less likely to hinder the stretching vibration because they are made of the elastic body.

In view of recent demand for downsizing of the ultrasonic actuator, the piezoelectric element is also required to be downsized. If the piezoelectric element is downsized, it is more difficult to attach the supporting parts only to the nodes in terms of accuracy. However, with use of the elastic body as the supporting parts, the hindrance to the vibration is reduced even if the supporting parts are misaligned with the nodes to some extent. Therefore, in the manufacturing process, high accuracy is no longer necessary. This makes it possible to manufacture the small-sized ultrasonic actuator with ease.

For improved adhesion between the piezoelectric element and the elastic body, as well as between the supporting members and the elastic body, the elastic body is preferably mounted in a compressed state.

Feeding electrodes 8 are provided on the front surface of the piezoelectric element 10. When a voltage is applied to the feeding electrodes 8, the piezoelectric element 10 vibrates in accordance with the frequency of the applied voltage. Though not shown, each of the feeding electrodes 8a, 8b, 8c and 8d has an end extending to the side surface of the piezoelectric element 10 (in particular, part of the side surface on which conductive parts of the supporting parts 6A, 7A, 7B and 9A to be described later abut) and exposed on the side surface of the piezoelectric element 10 to function as an external electrode.

Each of the first to third supporting members 6, 7 and 9 has conductive parts 51 and a lead electrode 11. When the conductive parts 51 abut the external electrodes of the feeding electrodes 8a, 8b, 8c and 8d exposed on the side surfaces of the piezoelectric element 10, the lead electrodes 11 and the feeding electrodes 8a, 8b, 8c and 8d of the piezoelectric element 10 are electrically connected via the conductive parts 51, respectively. That is, the supporting parts 6A, 6B, 7A, 7B and 9A serve as feeding terminals for supplying a voltage to the feeding electrodes 8a, 8b, 8c and 8d and constitute feeding-supporting parts.

With this configuration, soldered connection of wires to the piezoelectric element 10 is no longer necessary. This eliminates the possibility of cracking of the piezoelectric element 10 due to stress concentration on the soldered part of the piezoelectric element. Further, since the solders provided on the piezoelectric element 10 in the thickness direction are not required any more, the piezoelectric element 10 is reduced in thickness.

When silicon rubber is used as the elastic body used for the supporting parts 6A, 6B, 7A, 7B and 9A of the first to third supporting members 6, 7 and 9 and the silicone rubber compressed to a compressibility of 5 to 40% is mounted, adhesion between the feeding electrodes of the piezoelectric element 10 and the conductive parts 51, as well as between the conductive parts 51 and the lead electrodes 11 is stabilized. As a result, conductive resistance is stabilized and the characteristic of the ultrasonic actuator is stabilized. The compressibility is a ratio of a difference in length of the elastic body before and after the deformation to the length before the deformation. More specifically, when an elastic body of 1 mm length is compressed to 0.9 mm length, the compressibility is 10%.

A plurality of conductive parts 51 are provided in a single supporting member to improve the reliability. Metallic wires or metallic particles may be used as the conductive parts 51. If the metallic particles are used, durability is particularly improved because they are resistant against repetitive compression.

That is, the supporting members 6A, 6B, 7A, 7B and 9A may be made of conductive rubber.

The metallic wires used as the conductive parts 51 may be made of nickel, brass or those with gold plating as needed. The metallic particles may preferably be made of highly electrically conductive silver.

The feeding electrodes 8a to 8d, in particular the external electrodes, may be made of silver or a silver palladium alloy (Ag—Pd containing silver as a main ingredient). Or alternatively, they may be plated or baked with silver or a silver-palladium alloy.

If the feeding electrodes 8a, 8b, 8c and 8d or the surfaces thereof are mainly made of silver and the conductive parts 51 or the surfaces thereof are mainly made of silver, points of contact between the external electrodes of the feeding electrodes 8a, 8b, 8c and 8d and the conductive parts 51 are prevented from sulfuration and increase in conductive resistance. More specifically, silver is likely to be sulfurized by hydrogen sulfide and sulfur dioxide in the air. Therefore, when the external electrodes of the feeding electrodes 8a, 8b, 8c and 8d at least the surfaces of which are mainly made of silver are brought into contact with the conductive parts 51 at least the surfaces of which are mainly made of silver, silver constituting parts of the external electrodes of the feeding electrodes 8a, 8b, 8c and 8d and the conductive parts 51 exposed in the air is reacted with hydrogen sulfide and sulfur dioxide in the air and converted to silver sulfide. Thus, a silver sulfide film is formed to integrally cover the external electrodes of the feeding electrodes 8a, 8b, 8c and 8d and the conductive parts 51. As a result, the points of contact between the external electrodes of the feeding electrodes 8a, 8b, 8c and 8d and the conductive parts 51 are protected from hydrogen sulfide and sulfur dioxide in the air by the silver sulfide film. Thus, they are prevented from sulfuration.

The conductive parts 51 may be provided for all the supporting parts (the supporting parts 6A, 6B, 7A, 7B and 9A of the first to third supporting members 6, 7 and 9) or may be provided for any selected supporting part(s).

A driver element 2 is provided on the surface of the piezoelectric element 10 and abuts a movable object 3.

Next, the operation of the thus-configured ultrasonic actuator will be explained. FIGS. 3A to 3D are conceptual diagrams illustrating the operation of the piezoelectric element of the ultrasonic actuator according to the present invention.

Figure 23:
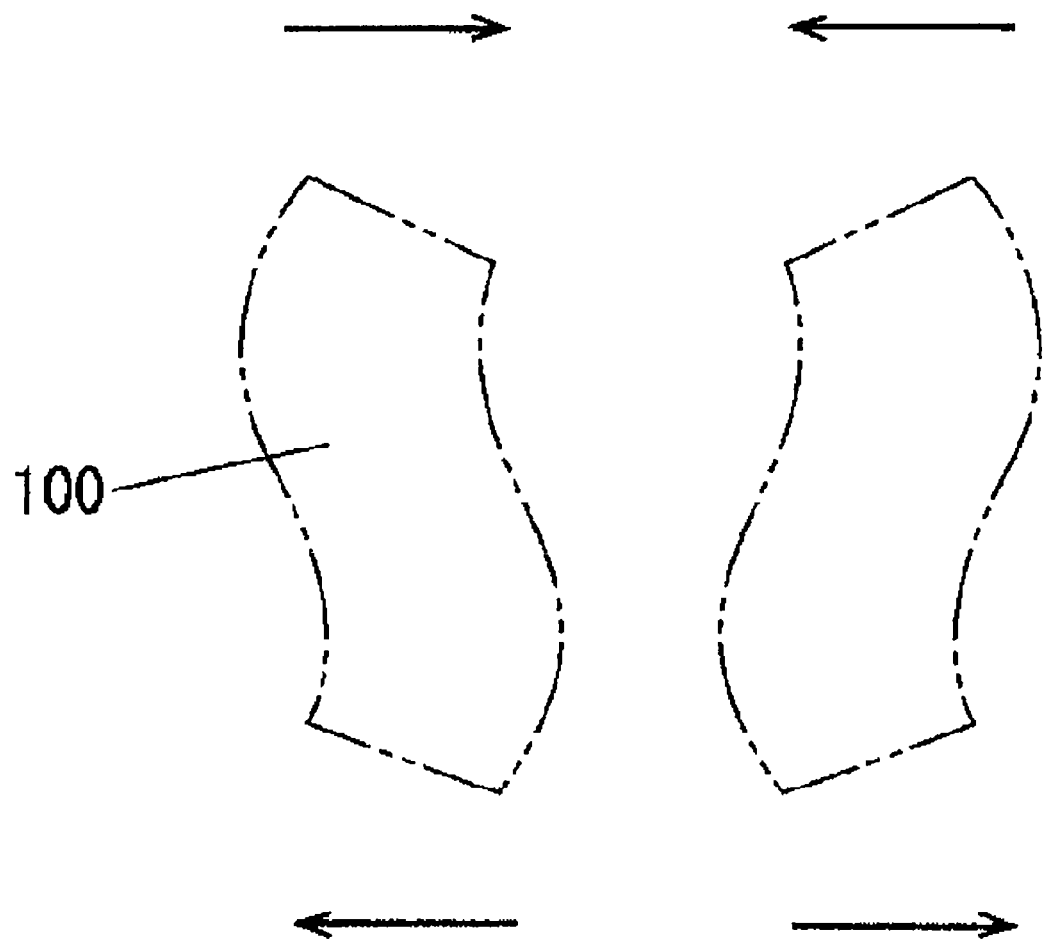
FIG. 23 is a diagram illustrating displacement in a second-order mode of bending vibration.
Figure 24:
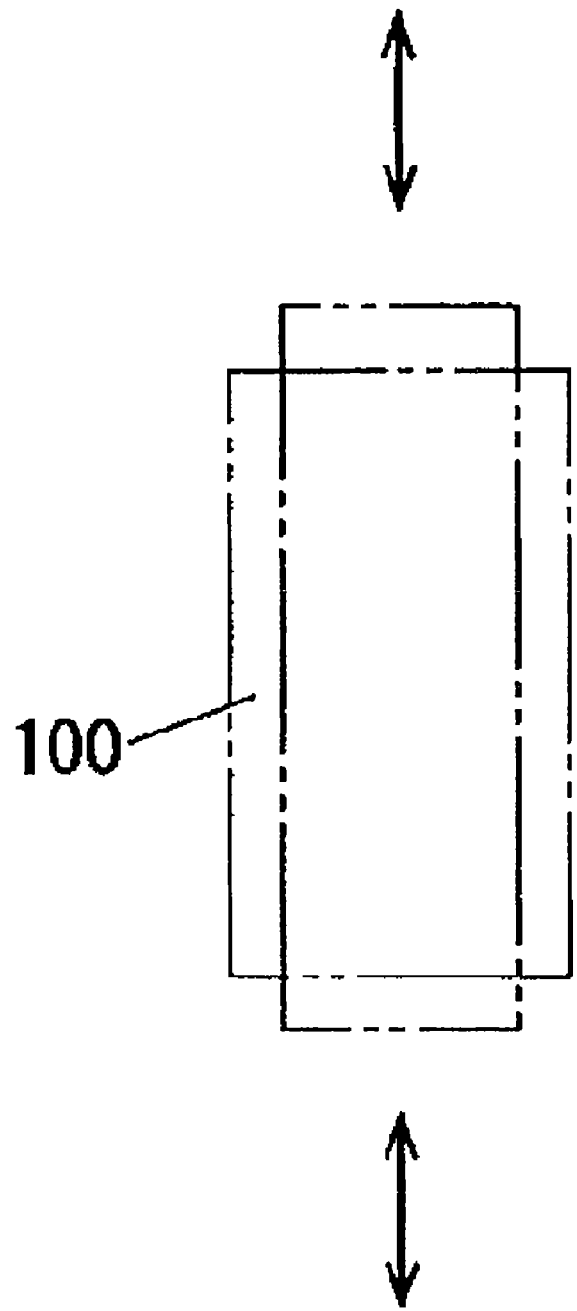
FIG. 24 is a diagram illustrating displacement in a first-order mode of stretching vibration.
Figure 25A:
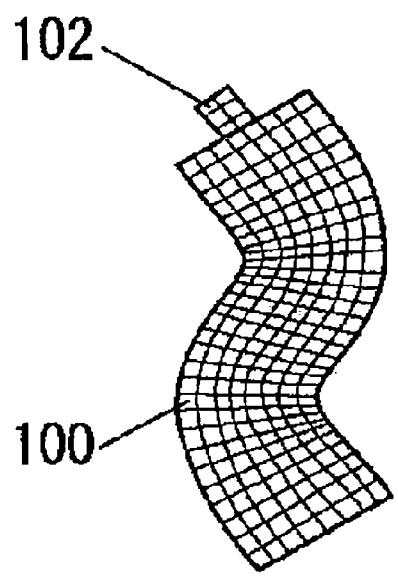
FIGS. 25A to 25D are conceptual diagrams illustrating the operation of the piezoelectric element.
Figure 25B:
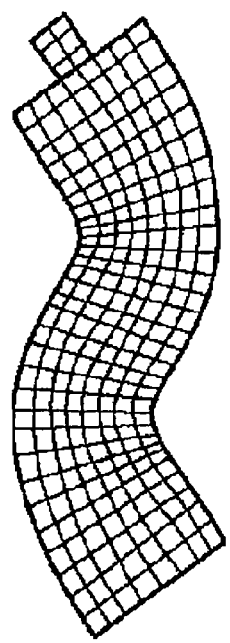
Figure 25C:
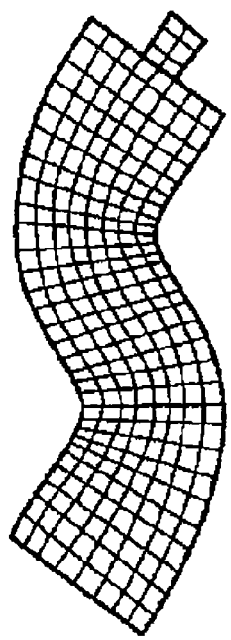
Figure 25D:
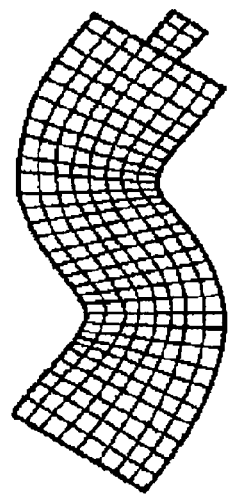

When AC voltage of a certain frequency is applied to a certain feeding electrode of the piezoelectric element 10, the piezoelectric element 10 is induced to vibrate in a second-order mode of bending vibration shown in FIG. 23 and a first-order mode of stretching vibration shown in FIG. 24. Resonance frequencies of the bending and stretching vibrations are determined by the material and shape of the piezoelectric element 10. When the two resonance frequencies are set almost equal and a voltage having a frequency near the set frequency is applied to the feeding electrodes 8a and 8c aligned on a diagonal line and the same voltage is applied to the feeding electrodes 8b and 8d aligned on another diagonal line while the phase is shifted by 90° or −90°, the piezoelectric element 10 is induced to vibrate in a second-order mode of bending vibration and a first-order mode of stretching vibration in a harmonious manner. The vibration direction of the second-order mode of bending vibration is the same as the moving direction of the movable object, i.e., the driving direction of driving force output by the driver element 2. The vibration direction of the first-order mode of stretching vibration is perpendicular to the moving direction of the movable object (i.e., the driving direction) and the same as the direction connecting the piezoelectric element 10 and the movable object 3 (the direction in which the driver element 2 supports the movable object 3).

Then, the shape of the piezoelectric element 10 varies sequentially in the order shown in FIGS. 3A to 3D. As a result, the driver element 2 provided on the piezoelectric element 10 makes a substantially elliptical motion as viewed in the direction perpendicular to the page surface. That is, the bending and stretching vibrations of the piezoelectric element 10 are combined to cause the elliptical motion of the driver element 2. Due to the elliptical motion, the movable object 3 on which the driver element 2 abuts moves in the direction of an arrow A or B shown in FIG. 2. Thus, the function of the ultrasonic actuator is achieved. In other words, the driver element 2 outputs driving force in the extending direction of the arrow A or B (a certain driving direction).

To be more specific, the piezoelectric element 10 made of piezoelectric ceramic material based on lead zirconate titanate is sized to have a length of 6 mm, a width of 1.7 mm and a thickness of 1 mm. The electrodes are arranged on the piezoelectric element 10 as shown in FIG. 1. When polarization in the thickness direction is caused, the resonance frequencies of the first-order mode of stretching vibration and the second-order mode of bending vibration are almost equal around 270 kHz.

The conductive parts 51 of the supporting part 9A connected to an electrode formed on almost the entire area of the rear surface of the piezoelectric element 10 are connected to ground. Then, a sinusoidal reference voltage of 270 kHz, 20 Vrms is applied to the conductive parts 51 of the supporting parts 6A and 7B connected to the electrodes 8*a* and 8*c* via the lead electrodes 11. A voltage having the same frequency, the same voltage value and a phase shifted by 90° or −90° is applied to the conductive parts 51 of the supporting parts 6B and 7A via the lead electrodes 11. Thus, the piezoelectric element 10 is induced to vibrate in the second-order mode of bending vibration and the first-order mode of stretching vibration in a harmonious manner. As a result, the shape of the piezoelectric element 10 varies sequentially in the order shown in FIGS. 3A to 3D and the driver element 2 makes a substantially elliptical motion.

Figure 2:
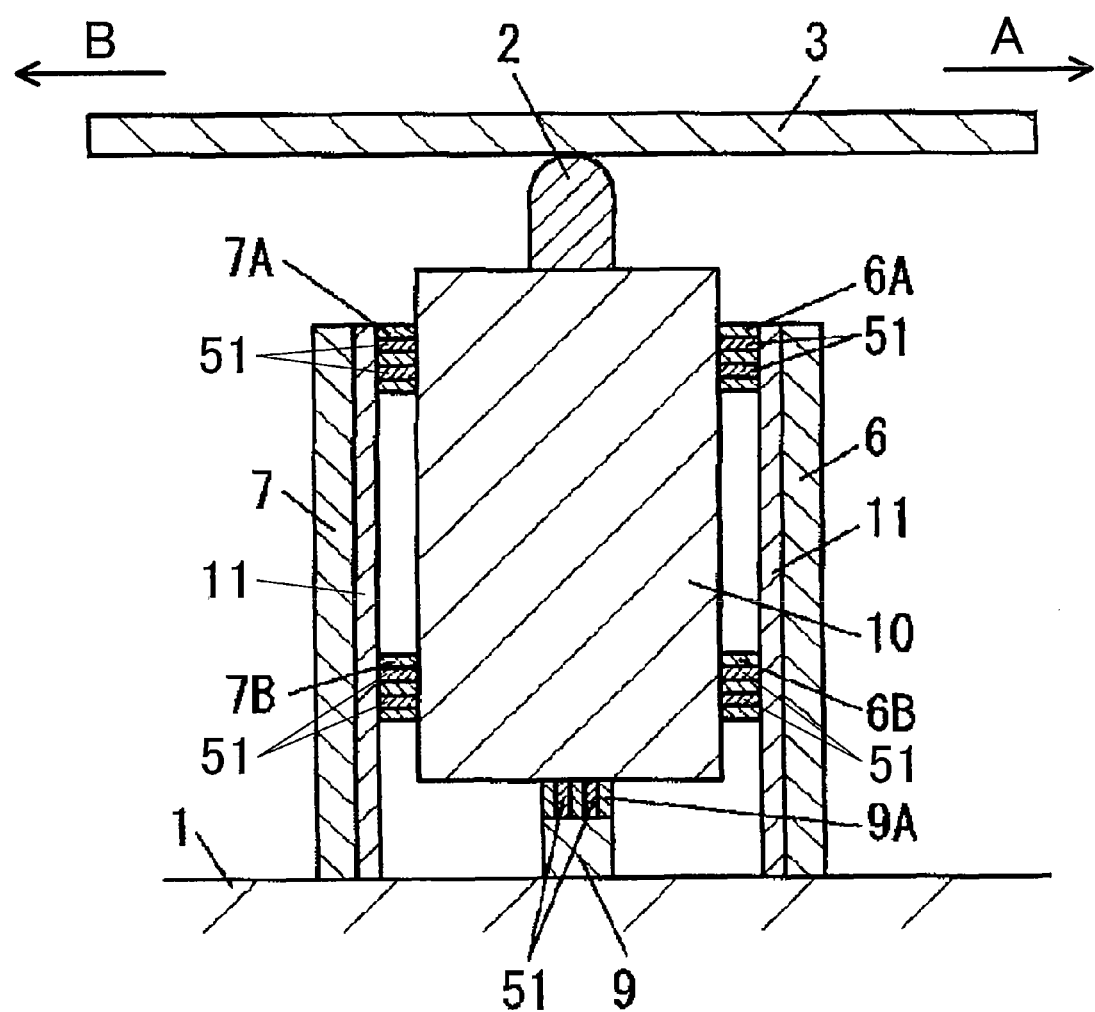
FIG. 2 is a sectional view of the ultrasonic actuator.
Figure 3A:
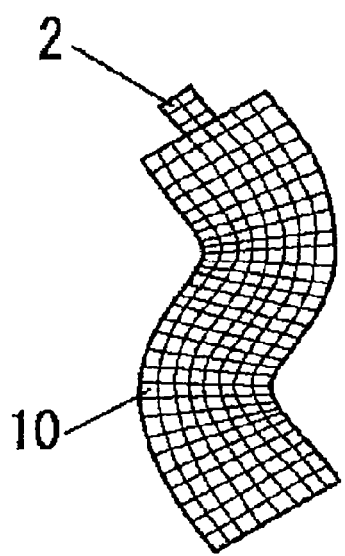
FIGS. 3A to 3D are conceptual diagrams illustrating the operation of the ultrasonic actuator.
Figure 3B:
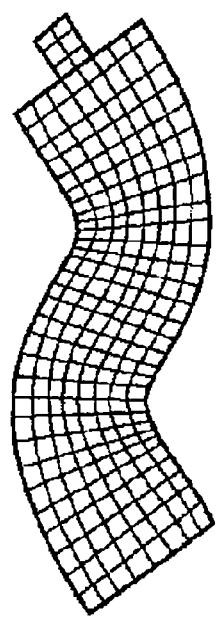
Figure 3C:
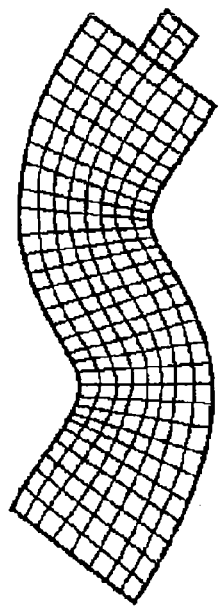
Figure 3D:
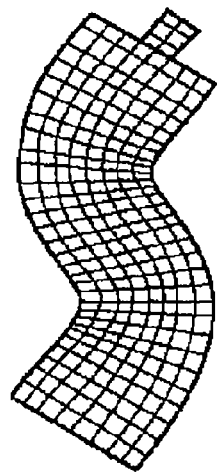

In the above-described explanation, the supporting parts 6A, 6B, 7A and 7B are provided on the first and second supporting members 6 and 7 aligned in the moving direction of the movable object 3 (the directions of A and B shown in FIG. 2). However, they may be provided on the first and second supporting members 6 and 7 aligned in the direction orthogonal to the moving direction of the movable object 3 (the directions of A and B shown in FIG. 2), i.e., the direction from the front surface to the rear surface of the piezoelectric element. Or alternatively, they may be provided in both of the directions. When the supporting parts of the first and second supporting members are provided on the first and second supporting members aligned in the direction orthogonal to the moving direction of the movable object 3 (the directions of A and B shown in FIG. 2), shaking of the piezoelectric element 10 in the direction orthogonal to the moving direction of the movable object 3 involved in the vibration is suppressed.

Thus, the vibration of the piezoelectric element 10 is converted to the elliptical motion of the driver element 2 with higher efficiency.

First Modification of First Embodiment

Figure 4:
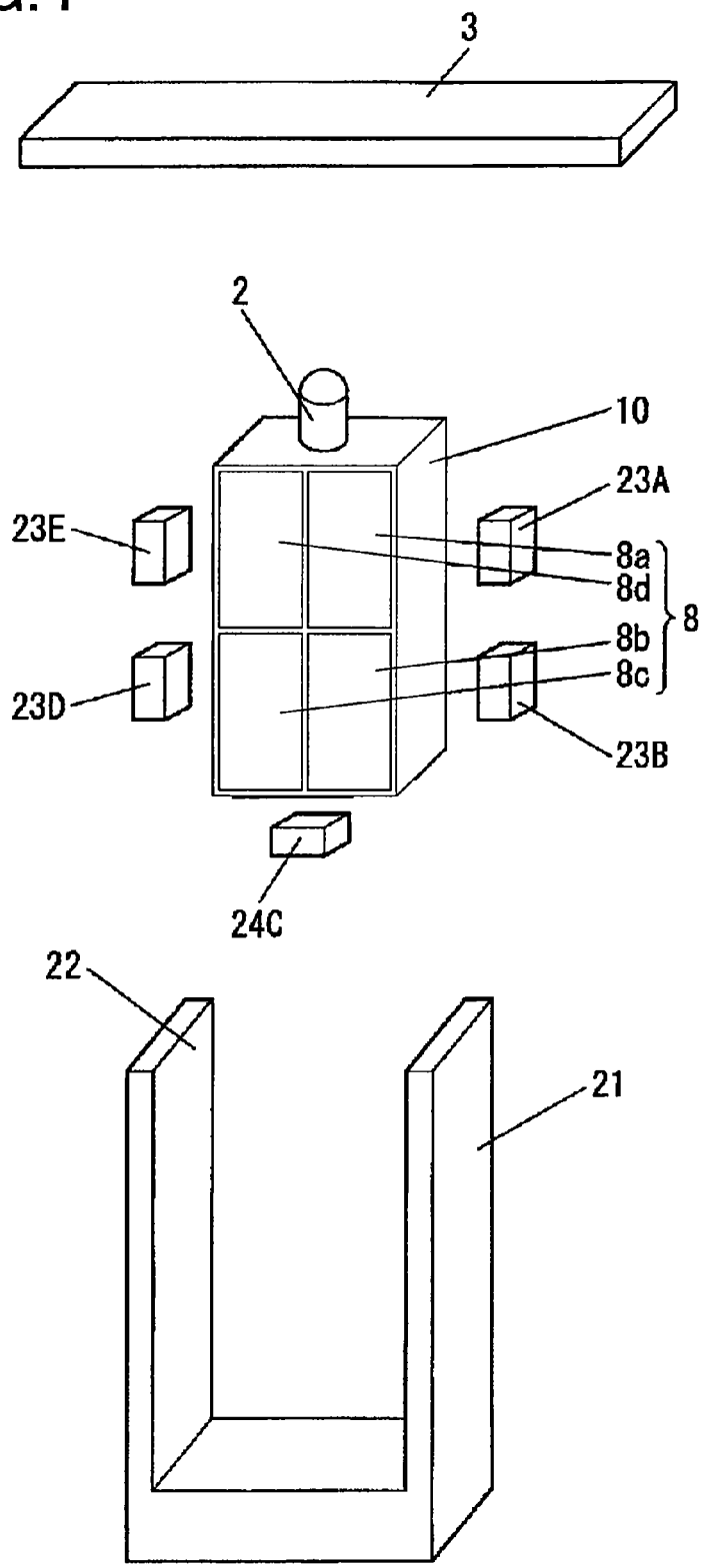
FIG. 4 is an exploded perspective view of an ultrasonic actuator according to a first modification of the first embodiment.
Figure 5:
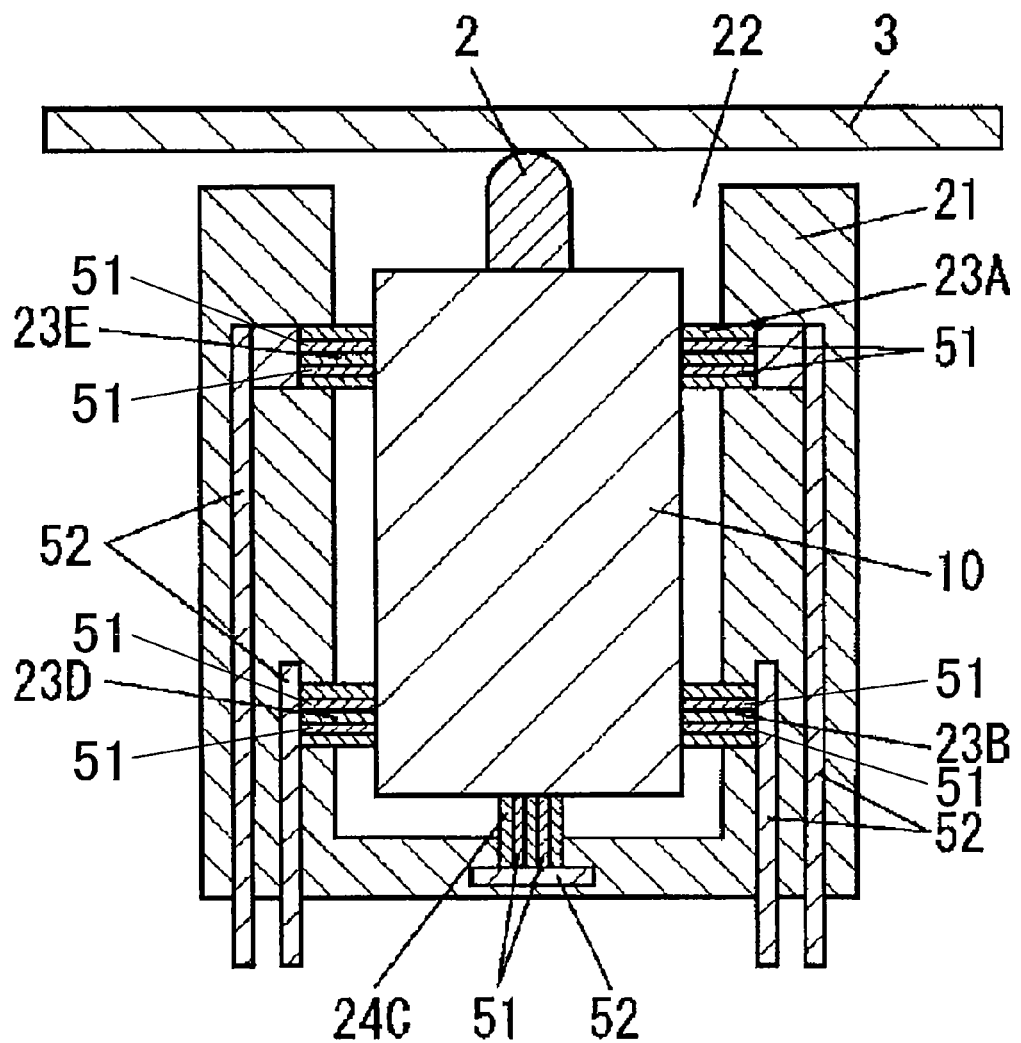
FIG. 5 is a sectional view of the ultrasonic actuator.

Subsequently, a modification of the first embodiment will be explained. FIGS. 4 and 5 show a first modification of the first embodiment.

In an ultrasonic actuator according to the first modification, a piezoelectric element 10 is contained in a case 21. Wall-surface supporting parts 23A, 23B, 23D and 23E are provided on the inner wall surfaces of the case 21 to support the piezoelectric element 10.

A bottom-surface supporting part 24C is provided on the inner bottom surface of the case 21 to support the piezoelectric element 10. The supporting parts 23A, 23B, 24C, 23D and 23E are made of an elastic body having elasticity lower than that of the piezoelectric element 10 and the case 21. More specifically, they may be made of an elastomer, silicone rubber or a leaf spring.

In particular, when the silicone rubber is used, surface contact is established between the supporting parts and the piezoelectric element 10 and between the supporting parts and the case 21. Further, as compared with other elastomers, elasticity of the silicon rubber is less likely to vary with temperature change and therefore stable support is achieved. In addition, the occurrence of noise caused by the vibration of the piezoelectric element 10 is prevented.

With use of the elastic body as the supporting parts, the hindrance to the vibration of the piezoelectric element 10 is reduced. As a result, the efficiency of the ultrasonic actuator is improved. In particular, since the bottom-surface supporting part 24C supports the piezoelectric element 10 at part thereof other than the node of the piezoelectric element 10 (non-node part), use of the elastic body has great effect of reducing the hindrance to the stretching vibration.

The wall-surface supporting parts 23A, 23B, 23D and 23E support the nodes of a bending vibration. Since the wall-surface supporting parts 23A, 23B, 23D and 23E are made of an elastic body, they are less likely to hinder the bending vibration as compared with the conventional supporting parts firmly secured on the piezoelectric element. Although the wall-surface supporting parts 23A, 23B, 23D and 23E do not support the nodes of the stretching vibration, they are less likely to hinder the stretching vibration because they are made of the elastic body.

In view of recent demand for downsizing of the ultrasonic actuator, the piezoelectric element is also required to be downsized. If the piezoelectric element is downsized, it is more difficult to attach the supporting parts only to the nodes in terms of accuracy. However, with use of the elastic body as the supporting parts, the hindrance to the vibration is reduced even if the supporting parts are misaligned with the nodes to some extent. Therefore, in the manufacturing process, high accuracy is no longer necessary. This makes it possible to manufacture the small-sized ultrasonic actuator with ease.

For improved adhesion between the piezoelectric element 10 and the elastic body, as well as between the case 21 and the elastic body, the elastic body is preferably mounted in a compressed state.

Feeding electrodes 8 are provided on the front surface of the piezoelectric element 10. When a voltage is applied to the feeding electrodes 8, the piezoelectric element 10 vibrates in accordance with the frequency of the applied voltage. Though not shown, each of the feeding electrodes 8*a*, 8*b*, 8*c* and 8*d* has an end extending to the side surface of the piezoelectric element 10 (in particular, part of the side surface on which conductive parts 51 of the wall-surface supporting parts 23A, 23B, 23D and 23E and the bottom-surface supporting part 24C to be described later abut) and exposed on the side surface of the piezoelectric element 10 to function as an external electrode.

Each of the wall-surface supporting parts 23A, 23B, 23D and 23E and the bottom-surface supporting part 24C has conductive parts 51 and a lead electrode 52. When the conductive parts 51 abut the external electrodes of the feeding electrodes 8a, 8b, 8c and 8d exposed on the side surfaces of the piezoelectric element 10, the lead electrodes 52 and the feeding electrodes 8a, 8b, 8c and 8d of the piezoelectric element 10 are electrically connected via the conductive parts 51, respectively.

With this configuration, soldered connection of wires to the piezoelectric element 10 is no longer necessary. This eliminates the possibility of cracking of the piezoelectric element 10 due to stress concentration on the soldered part of the piezoelectric element. Further, since the solders provided on the piezoelectric element 10 in the thickness direction are not required any more, the piezoelectric element 10 is reduced in thickness.

When silicon rubber is used as the elastic body used for the wall-surface supporting parts 23A, 23B, 23D and 23E and the bottom-surface supporting part 24C and the silicone rubber compressed to a compressibility of 5 to 40% is mounted, adhesion between the feeding electrodes of the piezoelectric element 10 and the conductive parts 51, as well as between the conductive parts 51 and the lead electrodes 52 of the case 21 is stabilized. As a result, conductive resistance is stabilized and the characteristic of the ultrasonic actuator is stabilized. The compressibility is a ratio of a difference in length of the elastic body before and after the deformation to the length before the deformation. More specifically, when an elastic body of 1 mm length is compressed to 0.9 mm length, the compressibility is 10%.

A plurality of conductive parts 51 are provided in a single supporting member to improve the reliability. Metallic wires or metallic particles may be used as the conductive parts 51. If the metallic particles are used, durability is particularly improved because they are resistant against repetitive compression.

The metallic wires used as the conductive parts 51 may be made of nickel, brass or those with gold plating as needed. The metallic particles may preferably be made of highly electrically conductive silver.

The feeding electrodes 8a to 8d, in particular the external electrodes, may be made of silver or a silver palladium alloy (Ag—Pd containing silver as a main ingredient). Or alternatively, they may be plated or baked with silver or a silver-palladium alloy.

If the feeding electrodes 8a, 8b, 8c and 8d or the surfaces thereof are mainly made of silver and the conductive parts 51 or the surfaces thereof are mainly made of silver, points of contact between the external electrodes of the feeding electrodes 8a, 8b, 8c and 8d and the conductive parts 51 are prevented from sulfuration and increase in conductive resistance at the points of contact is prevented. More specifically, silver is likely to be sulfurized by hydrogen sulfide and sulfur dioxide in the air. Therefore, when the external electrodes of the feeding electrodes 8a, 8b, 8c and 8d at least the surfaces of which are mainly made of silver are brought into contact with the conductive parts 51 at least the surfaces of which are mainly made of silver, silver constituting parts of the external electrodes of the feeding electrodes 8a, 8b, 8c and 8d and the conductive parts 51 exposed in the air is reacted with hydrogen sulfide and sulfur dioxide in the air and converted to silver sulfide. Thus, a silver sulfide film is formed to integrally cover the external electrodes of the feeding electrodes 8a, 8b, 8c and 8d and the conductive parts 51. As a result, the points of contact between the external electrodes of the feeding electrodes 8a, 8b, 8c and 8d and the conductive parts 51 are protected from hydrogen sulfide and sulfur dioxide in the air by the silver sulfide film. Thus, they are prevented from sulfuration.

The conductive parts 51 may be provided for all the supporting parts (the wall-surface supporting parts 23A, 23B, 23E, 23D and the bottom-surface supporting part 24C) or may be provided for any selected supporting part(s).

A driver element 2 is provided on the top surface of the piezoelectric element 10. The driver element 2 protrudes from the case 21 through an opening 22 provided in the top surface of the case 21 and abuts the movable object 3 located above the case 21.

The operation of the ultrasonic actuator according to the first modification is the same as that of the first embodiment.

Second Modification of First Embodiment

Figure 6:
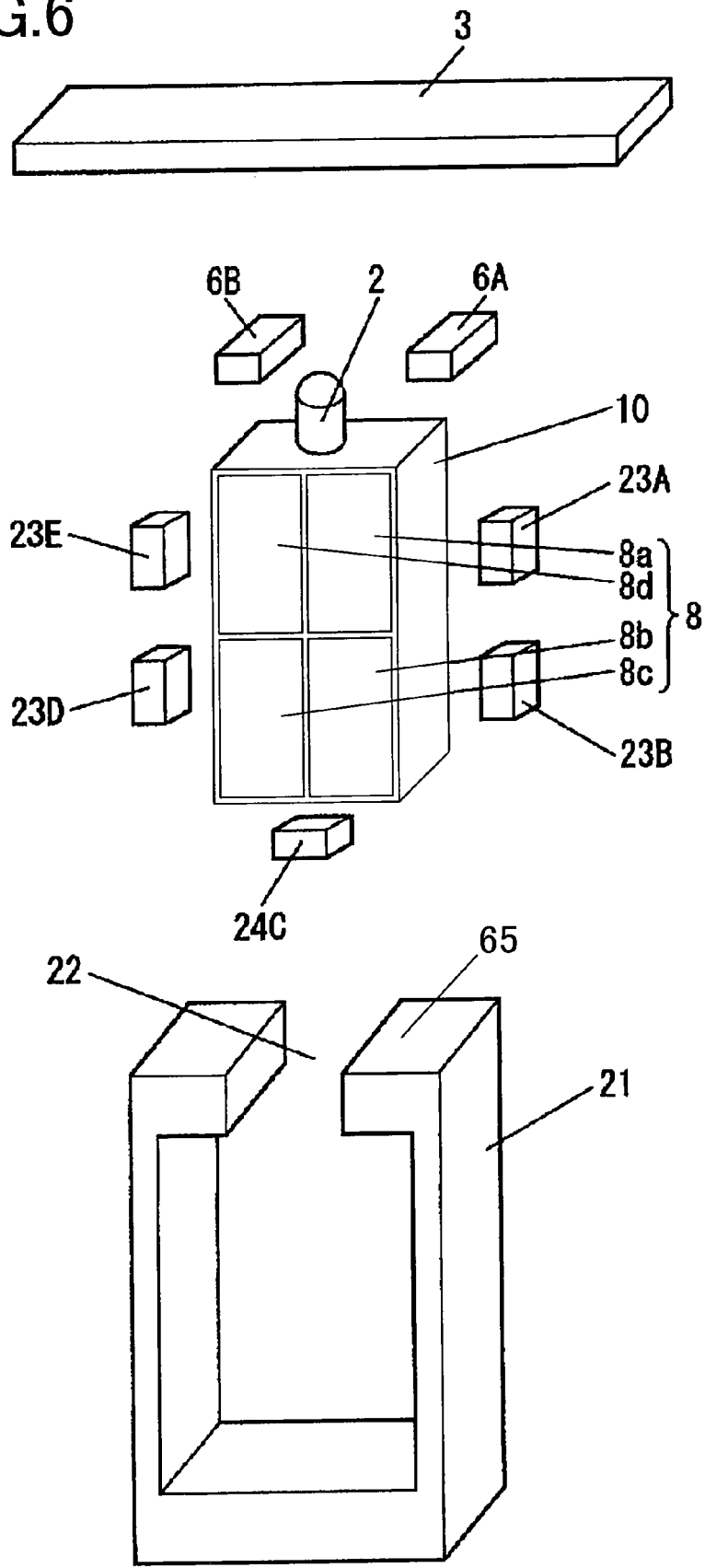
FIG. 6 is an exploded perspective view of an ultrasonic actuator according to a second modification of the first embodiment.
Figure 7:
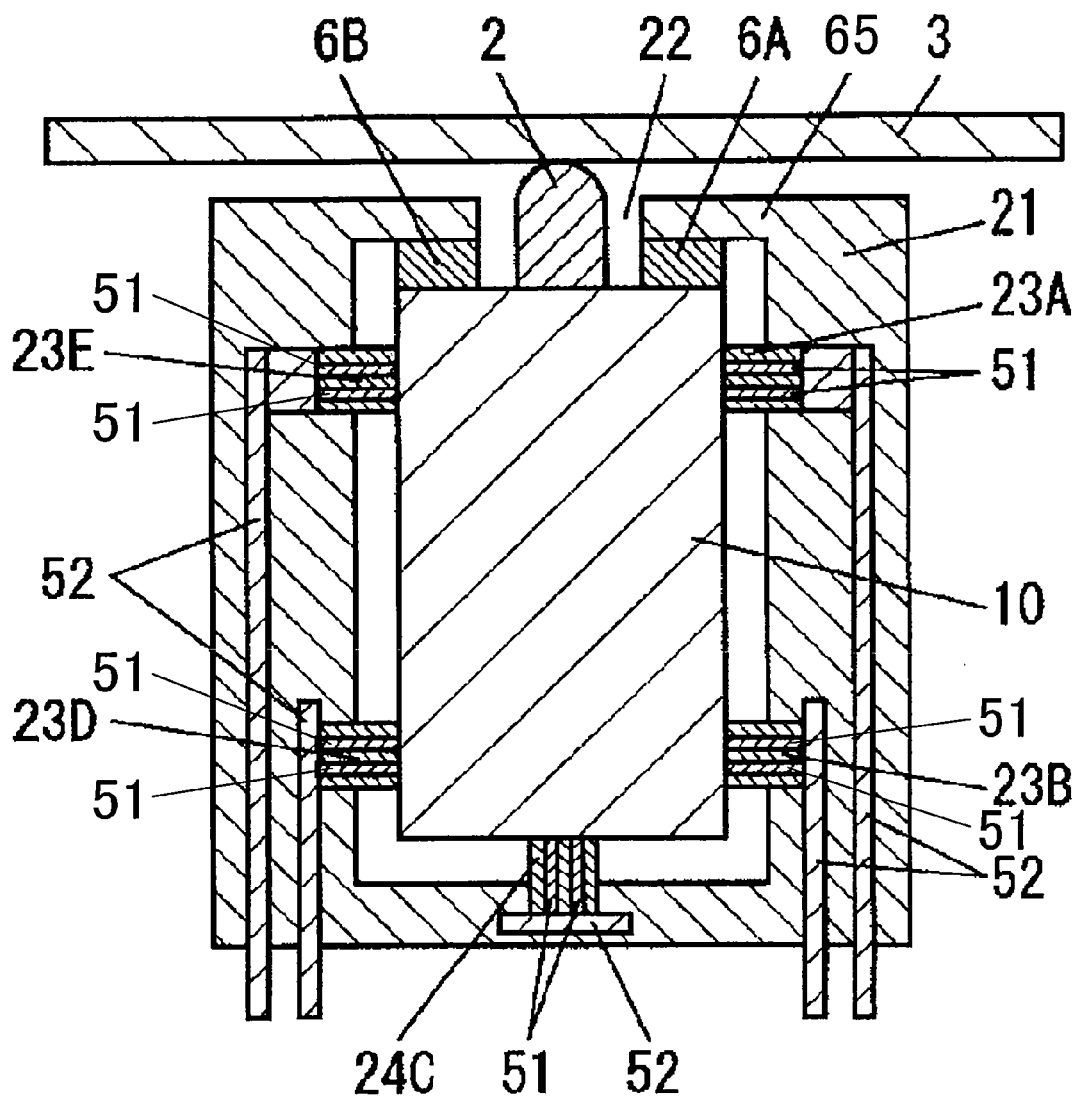
FIG. 7 is a sectional view of the ultrasonic actuator.

Subsequently, a second modification of the first embodiment will be explained. FIGS. 6 and 7 show the second modification of the first embodiment.

In an ultrasonic actuator according to the second modification, a piezoelectric element 10 is contained in a case 21. Wall-surface supporting parts 23A, 23B, 23D and 23E are provided on the inner wall surfaces of the case 21 to support the piezoelectric element 10.

An opening 22 is provided in the top surface of the case 21. The case 21 includes overhang portions 65 projecting over the opening 22. Top surface supporting parts 6A and 6B are provided on the overhang portions 65 to support the piezoelectric element 10, respectively. The wall-surface supporting parts 23A, 23B, 23D and 23E and the top surface supporting parts 6A and 6B are made of an elastic body. A bottom-surface supporting part 24C is also provided on the inner bottom surface of the case 21 to support the piezoelectric element 10. The bottom-surface supporting part 24C is also made of an elastic body.

The elastic body has lower elasticity than the piezoelectric element 10 and the case 21. Specifically, the elastic body may be an elastomer, silicone rubber or a leaf spring.

In particular, when the silicone rubber is used, surface contact is established between the supporting parts and the piezoelectric element 10 and between the supporting parts and the case 21. Therefore, the piezoelectric element 10 is supported with stability. Further, as compared with other elastomers, elasticity of the silicon rubber is less likely to vary with temperature change and therefore stable support is achieved. In addition, the occurrence of noise caused by the vibration of the piezoelectric element 10 is prevented.

With use of the elastic body as the supporting parts, the hindrance to the vibration of the piezoelectric element 10 is reduced. As a result, the efficiency of the ultrasonic actuator is improved. In particular, since the bottom-surface supporting part 24C and the top surface supporting parts 6A and 6B support the piezoelectric element 10 at parts thereof other than the node of the piezoelectric element 10 (non-node part), use of the elastic body has great effect of reducing the hindrance to the stretching vibration.

With the provision of the top surface supporting parts 6A and 6B, the piezoelectric element 10 is sandwiched between the top surface supporting parts 6A and 6B and the bottom-surface supporting part 24C. In addition, the piezoelectric element 10 is also supported by the wall-surface supporting parts 23A, 23B, 23D and 23E. Therefore, the piezoelectric element 10 is supported with improved stability.

The wall-surface supporting parts 23A, 23B, 23D and 23E support the nodes of the bending vibration. Since the wall-surface supporting parts 23A, 23B, 23D and 23E are made of an elastic body, they are less likely to hinder the bending vibration as compared with the conventional supporting parts firmly secured on the piezoelectric element. Although the wall-surface supporting parts 23A, 23B, 23D and 23E do not support the nodes of the stretching vibration, they are less likely to hinder the stretching vibration because they are made of the elastic body.

In view of recent demand for downsizing of the ultrasonic actuator, the piezoelectric element is also required to be downsized. If the piezoelectric element is downsized, it is more difficult to attach the supporting parts only to the nodes in terms of accuracy. However, with use of the elastic body as the supporting parts, the hindrance to the vibration is reduced even if the supporting parts are misaligned with the nodes to some extent. Therefore, in the manufacturing process, high accuracy is no longer necessary. This makes it possible to manufacture the small-sized ultrasonic actuator with ease.

For improved adhesion between the piezoelectric element 10 and the elastic body, as well as between the case 21 and the elastic body, the elastic body is preferably mounted in a compressed state.

Feeding electrodes 8 are provided on the front surface of the piezoelectric element 10. When a voltage is applied to the feeding electrodes 8, the piezoelectric element 10 vibrates in accordance with the frequency of the applied voltage. Though not shown, each of the feeding electrodes 8a, 8b, 8c and 8d has an end extending to the side surface of the piezoelectric element 10 (in particular, part of the side surface on which conductive parts 51 of the wall-surface supporting parts 23A, 23B, 23D and 23E and the bottom-surface supporting part 24C to be described later abut) and exposed on the side surface of the piezoelectric element 10 to function as an external electrode.

Each of the wall-surface supporting parts 23A, 23B, 23D and 23E and the bottom-surface supporting part 24C has conductive parts 51 and a lead electrode 52. When the conductive parts 51 abut the external electrodes of the feeding electrodes 8a, 8b, 8c and 8d exposed on the side surfaces of the piezoelectric element 10, the lead electrodes 52 and the feeding electrodes 8a, 8b, 8c and 8d of the piezoelectric element 10 are electrically connected via the conductive parts 51, respectively.

With this configuration, soldered connection of wires to the piezoelectric element 10 is no longer necessary. This eliminates the possibility of cracking of the piezoelectric element 10 due to stress concentration on the soldered part of the piezoelectric element. Further, since the solders provided on the piezoelectric element 10 in the thickness direction are not required any more, the piezoelectric element 10 is reduced in thickness.

When silicon rubber is used as the elastic body used for the wall-surface supporting parts 23A, 23B, 23D and 23E, the bottom-surface supporting part 24C and the top surface supporting parts 6A and 6B and the silicone rubber compressed to a compressibility of 5 to 40% is mounted, adhesion between the feeding electrodes of the piezoelectric element 10 and the conductive parts 51, as well as between the conductive parts 51 and the lead electrodes 52 of the case 21 is stabilized. As a result, conductive resistance is stabilized and the characteristic of the ultrasonic actuator is stabilized. The compressibility is a ratio of a difference in length of the elastic body before and after the deformation to the length before the deformation. More specifically, when an elastic body of 1 mm length is compressed to 0.9 mm length, the compressibility is 10%.

As the case 21 is pressed from below toward the movable object 3, the compressibility of the bottom-surface supporting part 24C is directly influenced by the pressing force of the case 21. The pressing force of the case 21 is selected such that the optimum characteristic of the ultrasonic actuator is obtained. Therefore, the pressing force may possibly be different from an optimum compressibility value of the bottom-surface supporting part 24C. However, with the provision of the top surface supporting parts 6A and 6B, the compressibility of the bottom-surface supporting part 24C is adjusted. Thus, stable characteristic is obtained.

A plurality of conductive parts 51 are provided in a single supporting member to improve the reliability. Metallic wires or metallic particles may be used as the conductive parts 51. If the metallic particles are used, durability is particularly improved because they are resistant against repetitive compression.

The metallic wires used as the conductive parts 51 may be made of nickel, brass or those with gold plating as needed. The metallic particles may preferably be made of highly electrically conductive silver.

The feeding electrodes 8a to 8d, in particular the external electrodes, may be made of silver or a silver palladium alloy (Ag—Pd containing silver as a main ingredient). Or alternatively, they may be plated or baked with silver or a silver-palladium alloy.

If the feeding electrodes 8a, 8b, 8c and 8d or the surfaces thereof are mainly made of silver and the conductive parts 51 or the surfaces thereof are mainly made of silver, points of contact between the external electrodes of the feeding electrodes 8a, 8b, 8c and 8d and the conductive parts 51 are prevented from sulfuration and increase in conductive resistance at the points of contact is prevented. More specifically, silver is likely to be sulfurized by hydrogen sulfide and sulfur dioxide in the air. Therefore, when the external electrodes of the feeding electrodes 8a, 8b, 8c and 8d at least the surfaces of which are mainly made of silver are brought into contact with the conductive parts 51 at least the surfaces of which are mainly made of silver, silver constituting parts of the external electrodes of the feeding electrodes 8a, 8b, 8c and 8d and the conductive parts 51 exposed in the air is reacted with hydrogen sulfide and sulfur dioxide in the air and converted to silver sulfide. Thus, a silver sulfide film is formed to integrally cover the external electrodes of the feeding electrodes 8a, 8b, 8c and 8d and the conductive parts 51. As a result, the points of contact between the external electrodes of the feeding electrodes 8a, 8b, 8c and 8d and the conductive parts 51 are protected from hydrogen sulfide and sulfur dioxide in the air by the silver sulfide film. Thus, they are prevented from sulfuration.

The conductive parts 51 may be provided for all the supporting parts (the wall-surface supporting parts 23A, 23B, 23E, 23D, the bottom-surface supporting part 24C and the top surface supporting parts 6A and 6B) or may be provided for any selected supporting part(s).

A driver element 2 is provided on the top surface of the piezoelectric element 10. The driver element 2 protrudes from the case 21 through an opening 22 provided in the top surface of the case 21 and abuts the movable object 3 located above the case 21.

The operation of the ultrasonic actuator according to the first modification is the same as that of the first embodiment.

Second Embodiment

Figure 8:
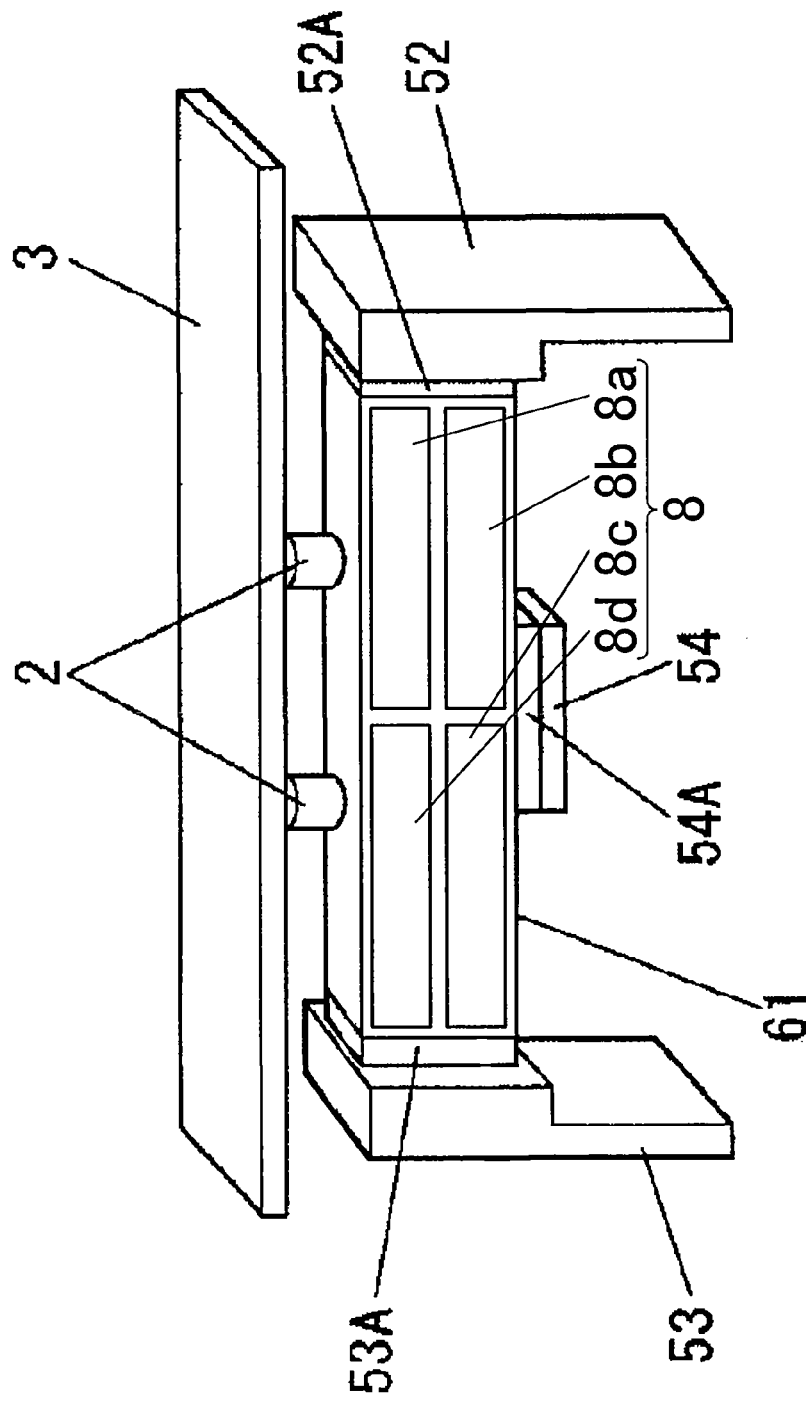
FIG. 8 is a perspective view of an ultrasonic actuator according to a second embodiment.
Figure 9:
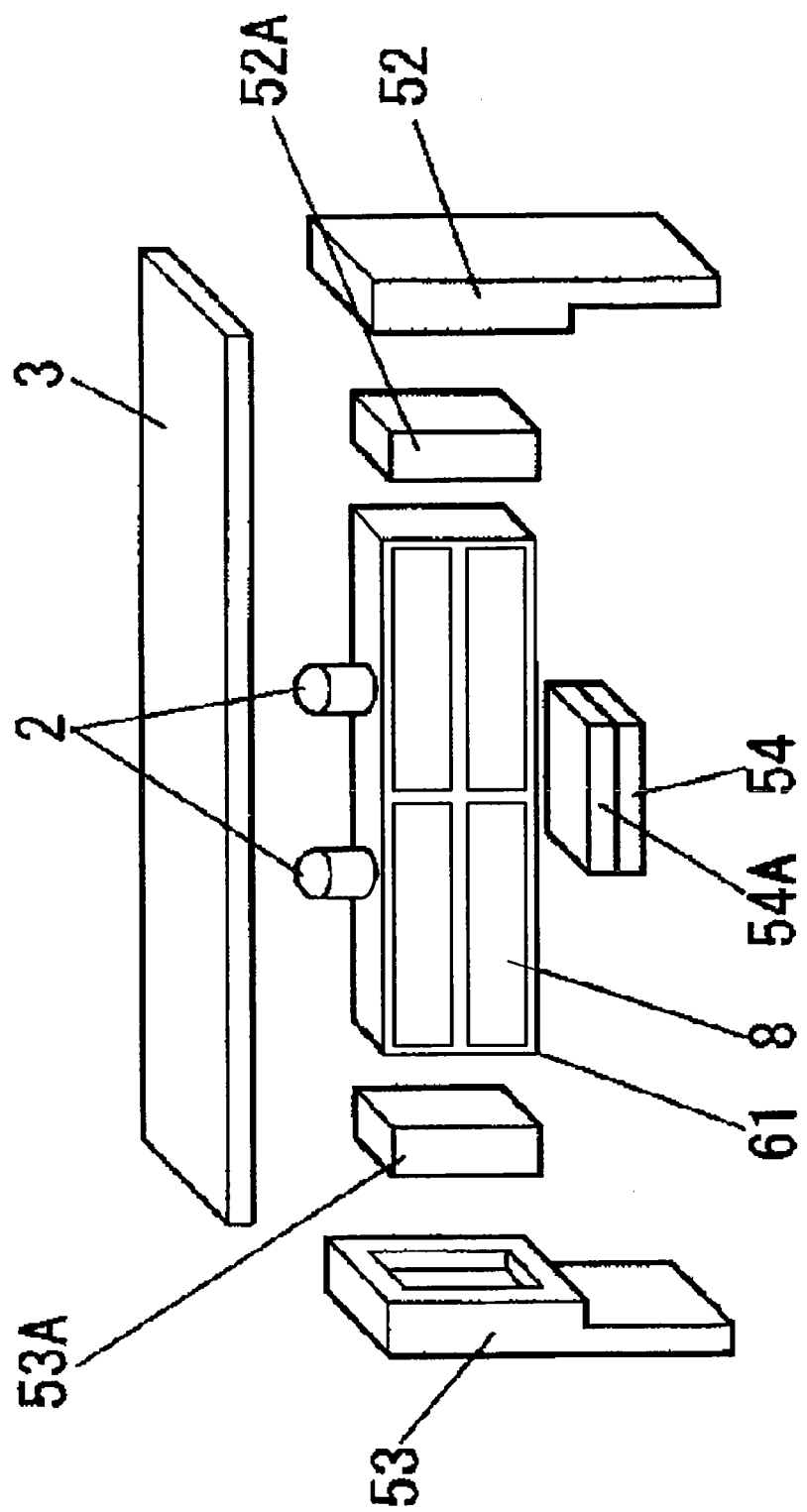
FIG. 9 is an exploded perspective view of the ultrasonic actuator.
Figure 10:
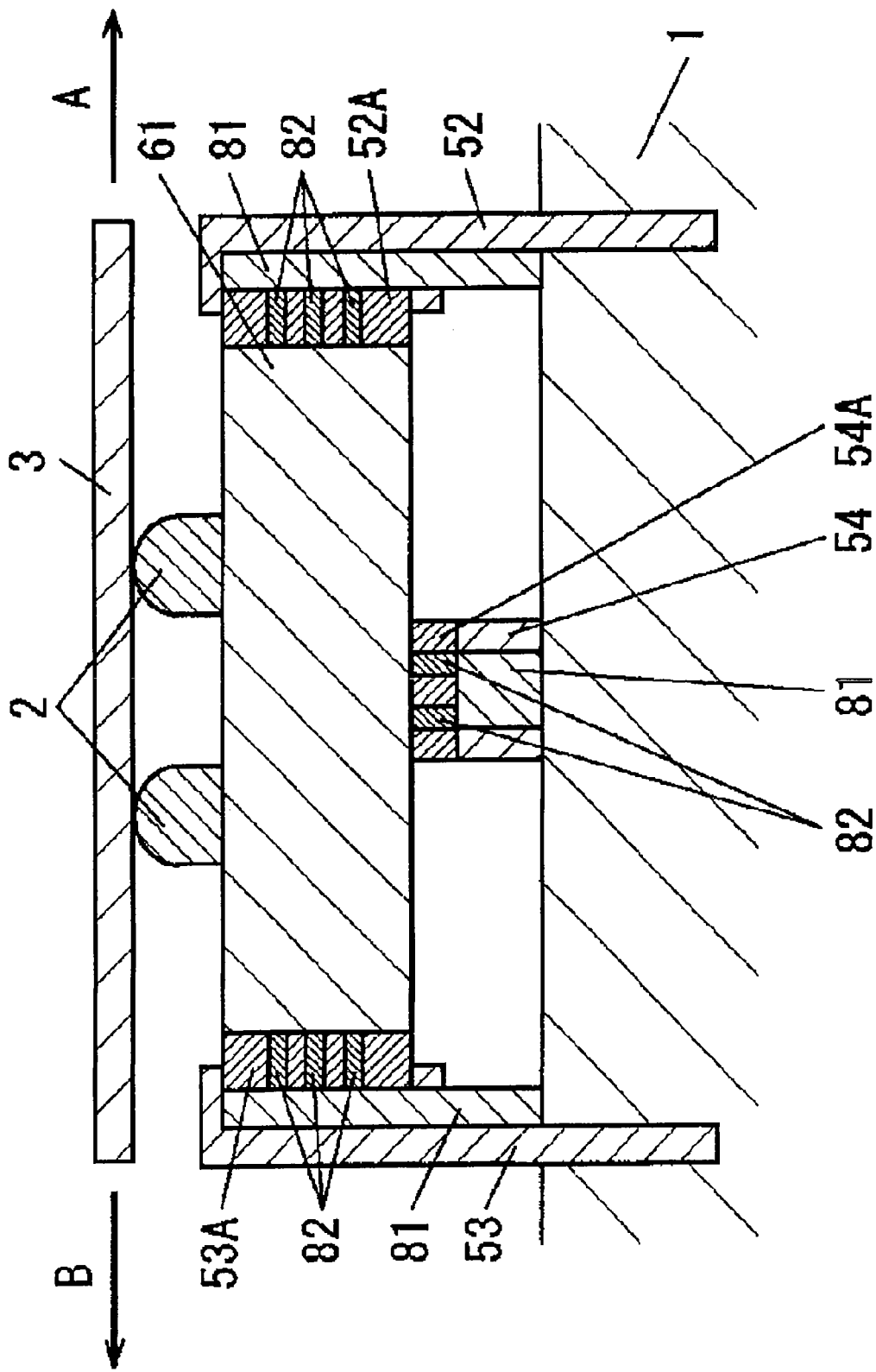
FIG. 10 is a sectional view of the ultrasonic actuator.
Figure 11A:
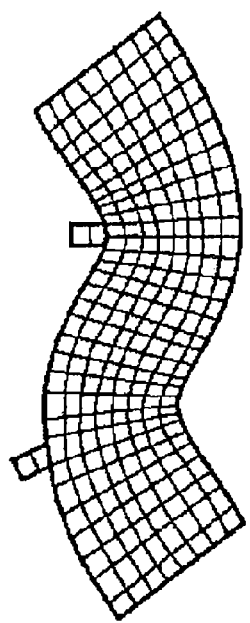
FIGS. 11A to 11D are conceptual diagrams illustrating the operation of the ultrasonic actuator according to the second embodiment.
Figure 11B:
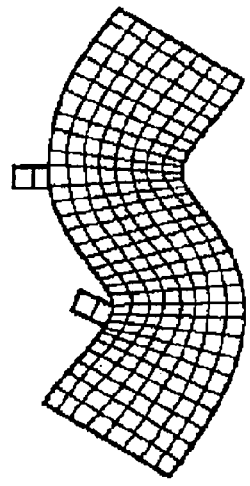
Figure 11C:
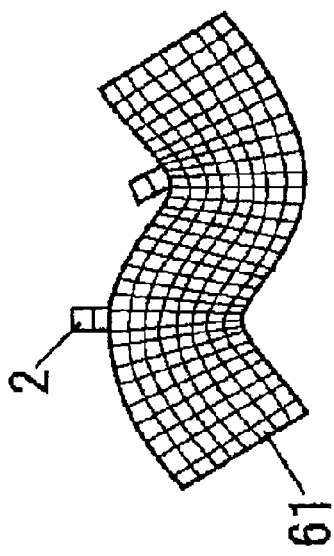
Figure 11D:
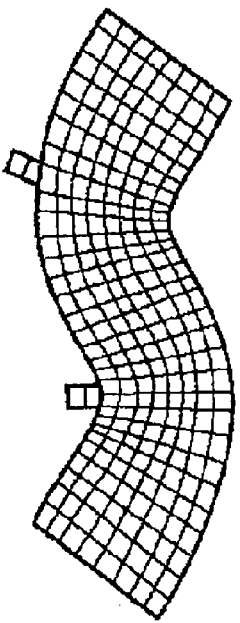

Next, a second embodiment of the present invention will be explained. FIGS. 8 to 10 show a basic configuration of an ultrasonic actuator according to the second embodiment. The second embodiment is different from the first embodiment in that the direction of a stretching vibration of a piezoelectric element 61 is the same as the moving direction of a movable object 3 (the driving direction of the ultrasonic actuator) and the direction of a bending vibration is perpendicular to the moving direction of the movable object 3 and the same as the direction connecting the piezoelectric element 61 and the movable object 3 (the direction in which driver elements support the movable object 3).

In the ultrasonic actuator according to the second embodiment, the piezoelectric element 61 is arranged between first and second supporting members 52 and 53 such that the direction of the stretching vibration of the piezoelectric element 61 is equal to the moving direction of the movable object 3 (the directions A and B shown in FIG. 10). Supporting parts 52A and 53A are provided on the first and second supporting members 52 and 53 aligned in the moving direction of the movable object 3. Further, a third supporting member 54 is provided on the bottom surface of the piezoelectric element 61 and a supporting part 54A thereof supports the piezoelectric element 61. Two driver elements 2 are provided on the top surface of the piezoelectric element 61 to abut the movable object 3.

The third supporting member 54 applies pressure such that the two driver elements 2 abutting the movable object 3 apply almost the same pressure to the movable object 3. Thus, the movable object 3 is operated with stability.

The supporting parts 52A, 53A and 54A of the first to third supporting members 52, 53 and 54 have conductive parts 82 just like those of the first embodiment. The first to third supporting members 52, 53 and 54 further include lead electrodes 81, respectively. When the conductive parts 82 abut external electrodes of feeding electrodes 8 exposed on the side surfaces of the piezoelectric element 61, the feeding electrodes 8 of the piezoelectric element 61 and the lead electrodes 81 are electrically connected via the conductive parts 82.

As described above, the difference of the second embodiment from the first embodiment is the arrangement of the piezoelectric element 61. The supporting parts 52A, 53A and 54A and the lead electrodes 81 are the same in material and structure as those of the first embodiment.

According to the first embodiment, the two supporting parts 6A and 6B (7A and 7B) are provided on a single side surface of the piezoelectric element 10. In contrast, according to the second embodiment, a single supporting part 52A (53A) is provided on a single side surface of the piezoelectric element 61. The piezoelectric element 61 is substantially divided into four portions by forming four feeding electrodes 8*a* to 8*d*. Therefore, in general, four external electrodes are extended from the four feeding electrodes 8*a* to 8*d* to the side surfaces of the piezoelectric element 61 and voltage is supplied through four supporting parts (conductive rubber) abutting the four external electrodes, respectively. However, in the ultrasonic actuator of the second embodiment, a voltage is supplied to the four feeding electrodes 8*a* to 8*d* through the two supporting parts 52A and 53A provided on the side surfaces of the piezoelectric element 61, respectively. Specifically, in the ultrasonic actuator according to the second embodiment, a certain AC voltage is applied to one pair of feeding electrodes 8*a* and 8*c* aligned on the diagonal line of the piezoelectric element 61, while another certain AC voltage is applied to another pair of feeding electrodes 8*b* and 8*d*, to generate a bending vibration and a stretching vibration. The external electrodes of the one pair of feeding electrodes 8*a* and 8*c* are located on one of the short side surfaces of the piezoelectric element 61, while the external electrodes of the another pair of feeding electrodes 8*b* and 8*d* are located on the other short side surface of the piezoelectric element 61. With this configuration, the external electrodes to which the same AC voltage is applied are gathered on each of the short side surfaces of the piezoelectric element 61. Therefore, the supporting part and the lead electrode 81 are shared by the electrodes on the same short side surface. More specifically, when a certain AC voltage is applied to the lead electrode 81 arranged on one of the short side surfaces of the piezoelectric element 61, the certain AC voltage is supplied to the feeding electrodes 8*a* and 8*c* aligned on the diagonal line of the piezoelectric element 61. Further, when another certain AC voltage is applied to the lead electrode 81 arranged on the other short side surface of the piezoelectric element 61, the another certain AC voltage is supplied to the feeding electrodes 8*b* and 8*d* aligned on a diagonal line of the piezoelectric element 61. The external electrodes of the pair of feeding electrodes 8*a* and 8*c* to which the same AC voltage will be applied may be formed in the following manner. For example, the external electrodes may be extended from the two feeding electrodes 8*a* and 8*c*, respectively, to the one of the short side surfaces. Or alternatively, the feeding electrodes 8*a* and 8*c* are electrically connected to each other and the external electrode may be extended from one of the feeding electrodes 8*a* and 8*c* to the one of the short side surfaces. The another pair of feeding electrodes 8*b* and 8*d* to which the same AC voltage will be applied are formed in the same manner. Thus, since only the pair of external electrodes of the feeding electrodes 8*a* and 8*c* (8*b* and 8*d*) to which the same voltage will be applied are formed on each of the short side surfaces of the piezoelectric element 61, only a single supporting part (conductive rubber) 52A (52B) and a single lead electrode 81 are provided on the short side surface of the piezoelectric element 61. Therefore, the structure is simplified. For example, according to the first and second modifications of the first embodiment in which the supporting parts 23A, 23B, 23D and 23E and the lead electrodes 52 are provided for the external electrodes of the feeding electrodes 8*a* to 8*d*, respectively, the supporting parts 23A, 23B, 23D and 23E have to be aligned accurately with the external electrodes formed on the piezoelectric element in the process of assembling the ultrasonic actuator. In particular, high assembly accuracy is required if the ultrasonic actuator is downsized. In comparison with the above, in the ultrasonic actuator according to the second embodiment, only the external electrodes of the feeding electrodes 8 to which the same AC voltage will be applied are provided on each of the short side surfaces of the piezoelectric element 61 and a single supporting part and a single lead electrode are shared between the external electrodes on the same short side surface. Therefore, even if the assembly accuracy is not so high, the external electrodes of the feeding electrodes 8 abut the supporting part. Thus, the electrical conduction is ensured.

The supporting part 52A (52B) and the lead electrode 81 may not be shared on one of the short side surfaces of the piezoelectric element 61. For example, the external electrodes of the feeding electrodes 8*a* and 8*b* to which different AC voltages will be applied may be provided on the one of the short side surfaces of the piezoelectric element 61. In this case, two supporting parts corresponding to the two external electrodes provided on the one of the short side surfaces are provided and two corresponding lead electrodes 81 may be provided on the two supporting parts (see FIGS. 5 and 7). With this configuration, different AC voltages are applied to the two lead electrodes 81 to supply the different AC voltages to the feeding electrodes 8a and 8b via the supporting parts. Or alternatively, a single supporting part including two conductive parts corresponding to the two external electrodes and electrically insulated from each other by an insulating member may be provided on the one of the short side surfaces and two lead electrodes 81 corresponding to the two conductive parts 82 may be provided. With this configuration, different AC voltages are applied to the two lead electrodes 81 to supply the different AC voltages to the feeding electrodes 8a and 8b via the conductive parts 82.

Next, the operation of the thus-configured ultrasonic actuator will be explained with reference to FIG. 11.

When AC voltage of a certain frequency is applied to a certain feeding electrode of the piezoelectric element 61 via the conductive part 82, the piezoelectric element 61 is induced to vibrate in a second-order mode of bending vibration shown in FIG. 23 and a first-order mode of stretching vibration shown in FIG. 24. Resonance frequencies of the bending and stretching vibrations are determined by the material and shape of the piezoelectric element. When the two resonance frequencies are set almost equal and a voltage having a frequency near the set frequency is applied to the feeding electrodes 8a and 8c aligned on a diagonal line and the same voltage is applied to the feeding electrodes 8b and 8d aligned on another diagonal line while the phase is shifted by 90° or −90°, the piezoelectric element 61 is induced to vibrate in a second-order mode of bending vibration and a first-order mode of stretching vibration in a harmonious manner. As a result, the shape of the piezoelectric element 61 varies sequentially in the order shown in FIGS. 11A to 11D and the two driver elements 2 provided on the piezoelectric element 61 make a substantially elliptical motion as viewed from the direction perpendicular to the page surface. That is, the bending and stretching vibrations of the piezoelectric element 61 are combined to cause the elliptical motion of the driver elements 2. Due to the elliptical motion, the movable object 3 on which the two driver elements 2 abut moves in the direction of an arrow A or B shown in FIG. 10. Thus, the function of the ultrasonic actuator is achieved.

As described above, according to the present invention, at least the supporting part of the supporting member of the piezoelectric element is made of an elastic body. Thus, the present invention has the effect of improving the efficiency of the ultrasonic actuator.

With this configuration, soldered connection of wires to the piezoelectric element 61 is no longer necessary. This eliminates the possibility of cracking of the piezoelectric element 61 due to stress concentration on the soldered part of the piezoelectric element. Further, since the solders provided on the piezoelectric element 61 in the thickness direction are not required any more, the piezoelectric element 61 is reduced in thickness.

Other effects of the first embodiment are obtained also in the second embodiment.

First Modification of Second Embodiment

Figure 12:
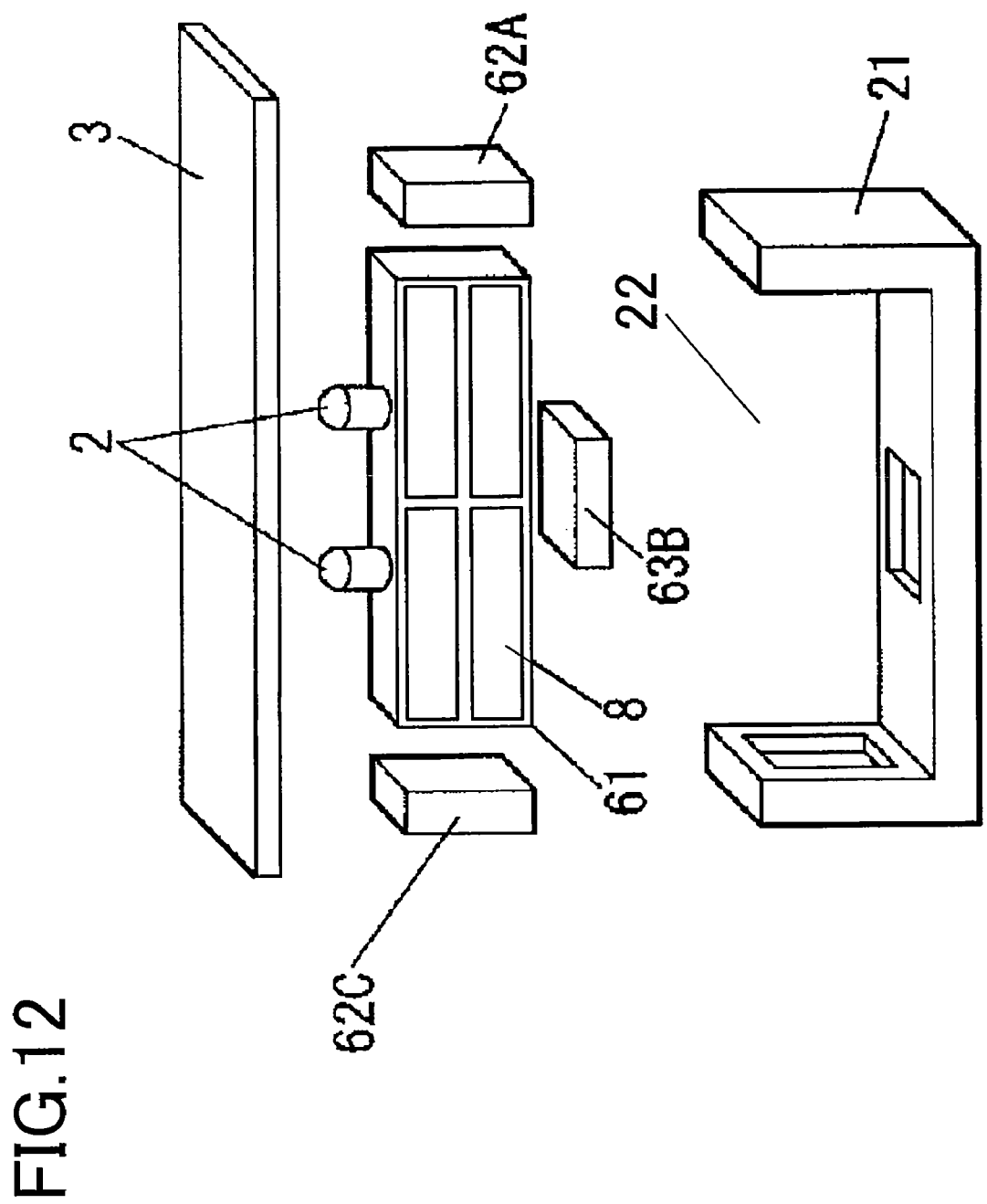
FIG. 12 is an exploded perspective view of an ultrasonic actuator according to a first modification of the second embodiment.
Figure 13:
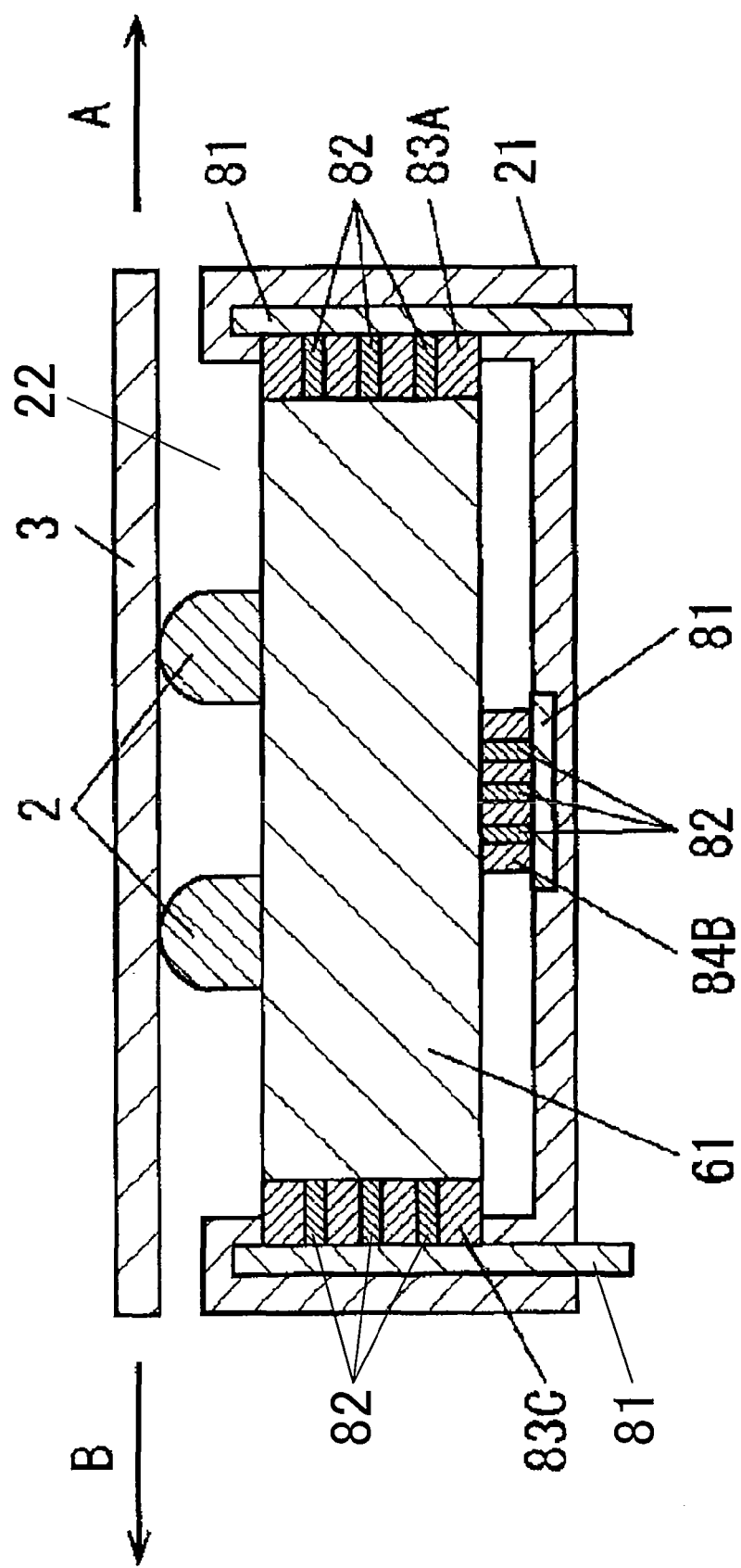
FIG. 13 is a sectional view of the ultrasonic actuator.

Next, a modification of the second embodiment will be explained. FIGS. 12 and 13 show a first modification of the second embodiment.

In an ultrasonic actuator according to the first modification, a piezoelectric element 61 is contained in a case 21. Wall-surface supporting parts 62A and 62C are provided on the inner wall surfaces of the case 21 aligned in same the direction as the moving direction of the movable object 3. A bottom-surface supporting part 63B is provided on the inner bottom surface of the case 21 to support the piezoelectric element 61. Two driver elements 2 are provided on the top surface of the piezoelectric element 61. The driver elements 2 protrude from the case 21 through an opening 22 provided in the top surface of the case 21 and abut the movable object 3 located above the case 21.

The bottom-surface supporting part 63B applies pressure such that the two driver elements 2 abutting the movable object 3 apply almost the same pressure to the movable object 3. Thus, the movable object 3 is operated with stability.

The wall-surface supporting parts 62A and 62B and the bottom-surface supporting part 63B have conductive parts 82 just like those of the first embodiment. As shown in FIG. 13, lead electrodes 81 are provided in the inner wall surfaces and the inner bottom surface of the case 21. When the conductive parts 82 abut the feeding electrodes 8 exposed on the side surfaces of the piezoelectric element 61, the feeding electrodes 8 of the piezoelectric element 61 and the lead electrodes 81 are electrically connected via the conductive parts 82.

The operation of the ultrasonic actuator according to the first modification is the same as that of the ultrasonic actuator according to the second embodiment.

Second Modification of Second Embodiment

Figure 14:
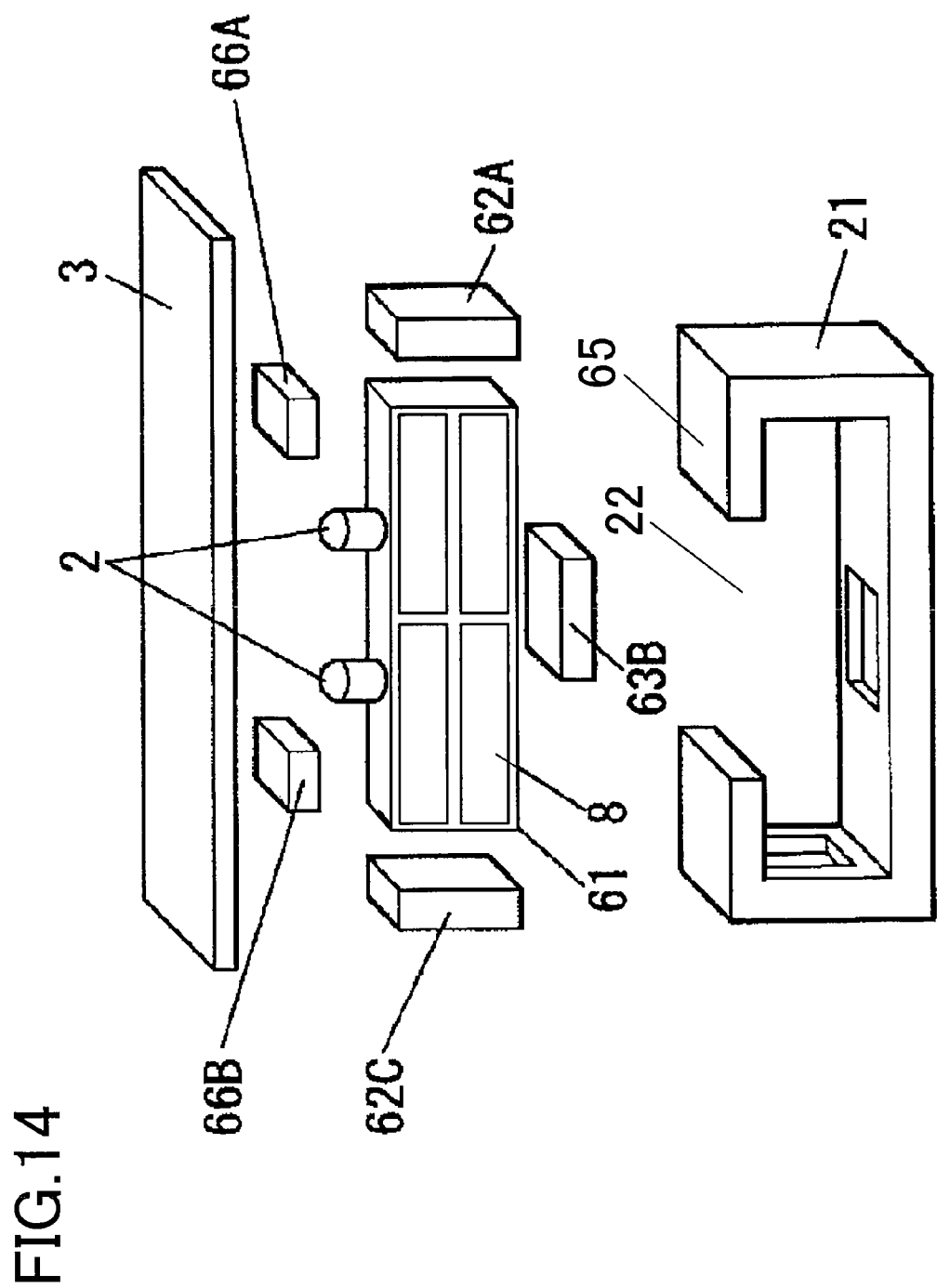
FIG. 14 is an exploded perspective view of an ultrasonic actuator according to a second modification of the second embodiment.
Figure 15:
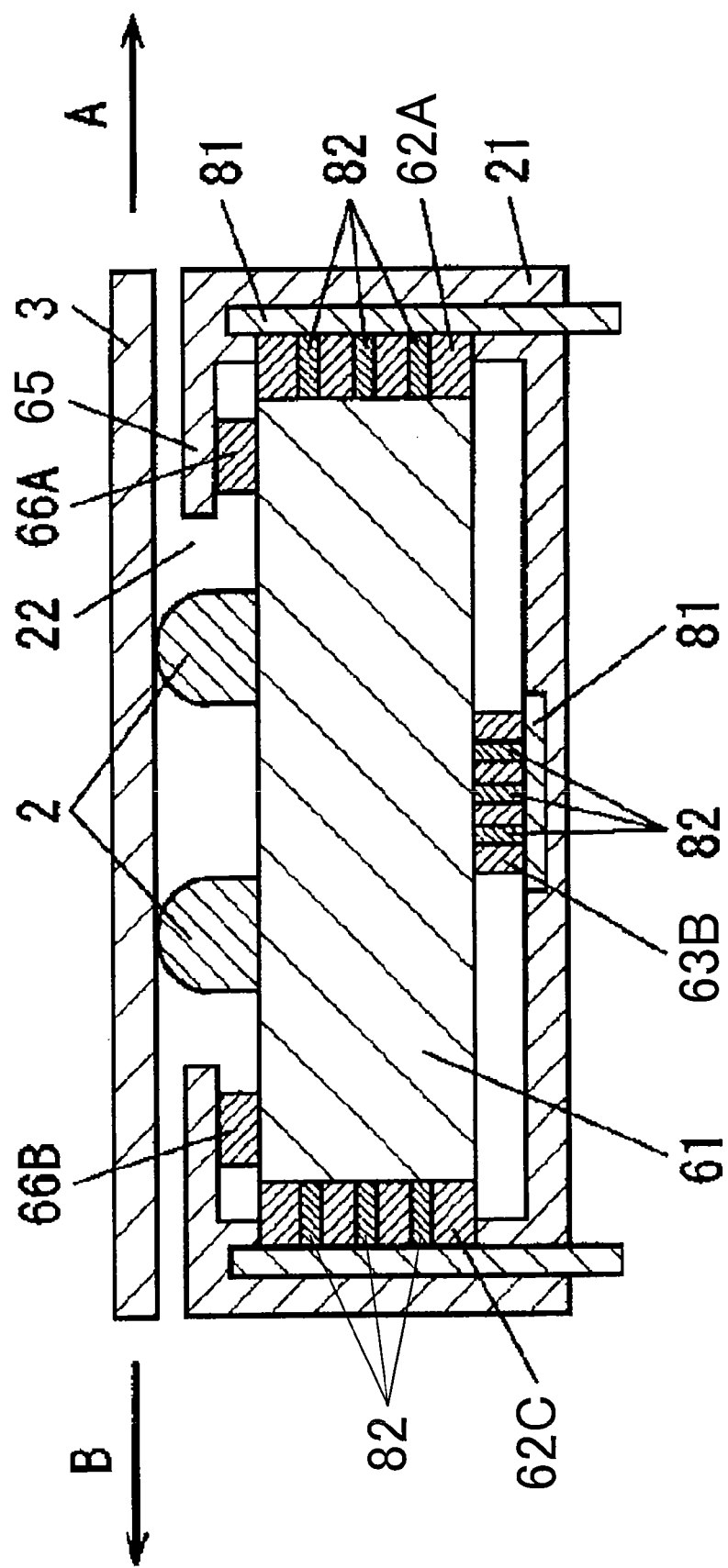
FIG. 15 is a sectional view of the ultrasonic actuator.

Next, a second modification of the second embodiment will be explained. FIGS. 14 and 15 show the second modification of the second embodiment.

In an ultrasonic actuator according to the second modification, a piezoelectric element 61 is contained in a case 21. Wall-surface supporting parts 62A and 62C are provided on the inner wall surfaces of the case 21 aligned in the same direction as the moving direction of the movable object 3. A bottom-surface supporting part 63B is provided on the inner bottom surface of the case 21 and top surface supporting parts 66A and 66B are provided on overhang portions 65 of the case 21 to support the piezoelectric element 61, respectively. Two driver elements 2 are provided on the top surface of the piezoelectric element 61. The driver elements 2 protrude from the case 21 through an opening 22 provided in the top surface of the case 21 and abut the movable object 3 located above the case 21.

The bottom-surface supporting part 63B applies pressure such that the two driver elements 2 abutting the movable object 3 apply almost the same pressure to the movable object 3. Thus, the movable object 3 is operated with stability.

The wall-surface supporting parts 62A and 62B and the wall-surface supporting part 63B have conductive parts 82 just like those of the first embodiment. As shown in FIG. 15, lead electrodes 81 are provided in the inner wall surfaces and the inner bottom surface of the case 21. When the conductive parts 82 abut the feeding electrodes 8 exposed on the side surfaces of the piezoelectric element 61, the feeding electrodes 8 of the piezoelectric element 61 and the lead electrodes 81 are electrically connected via the conductive parts 82.

Material and structure of the wall-surface supporting parts 62A and 62B, the bottom-surface supporting part 63B and the lead electrodes 81 are the same as those described in the second embodiment.

The operation of the ultrasonic actuator according to the second modification is the same as that of the ultrasonic actuator according to the second embodiment.

Reference Embodiments

Figure 16:
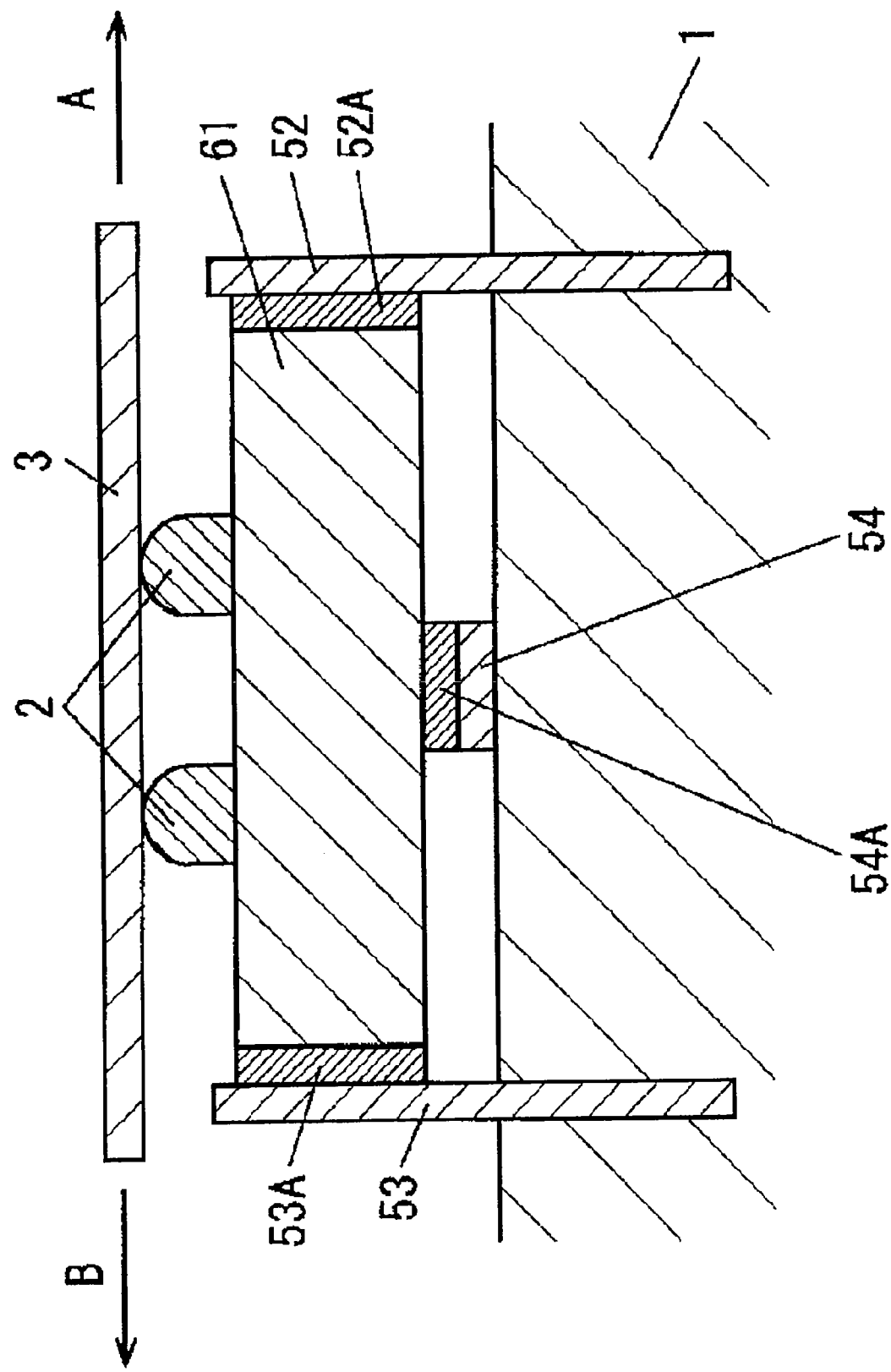
FIG. 16 is a sectional view of an ultrasonic actuator according to a reference embodiment.
Figure 17:
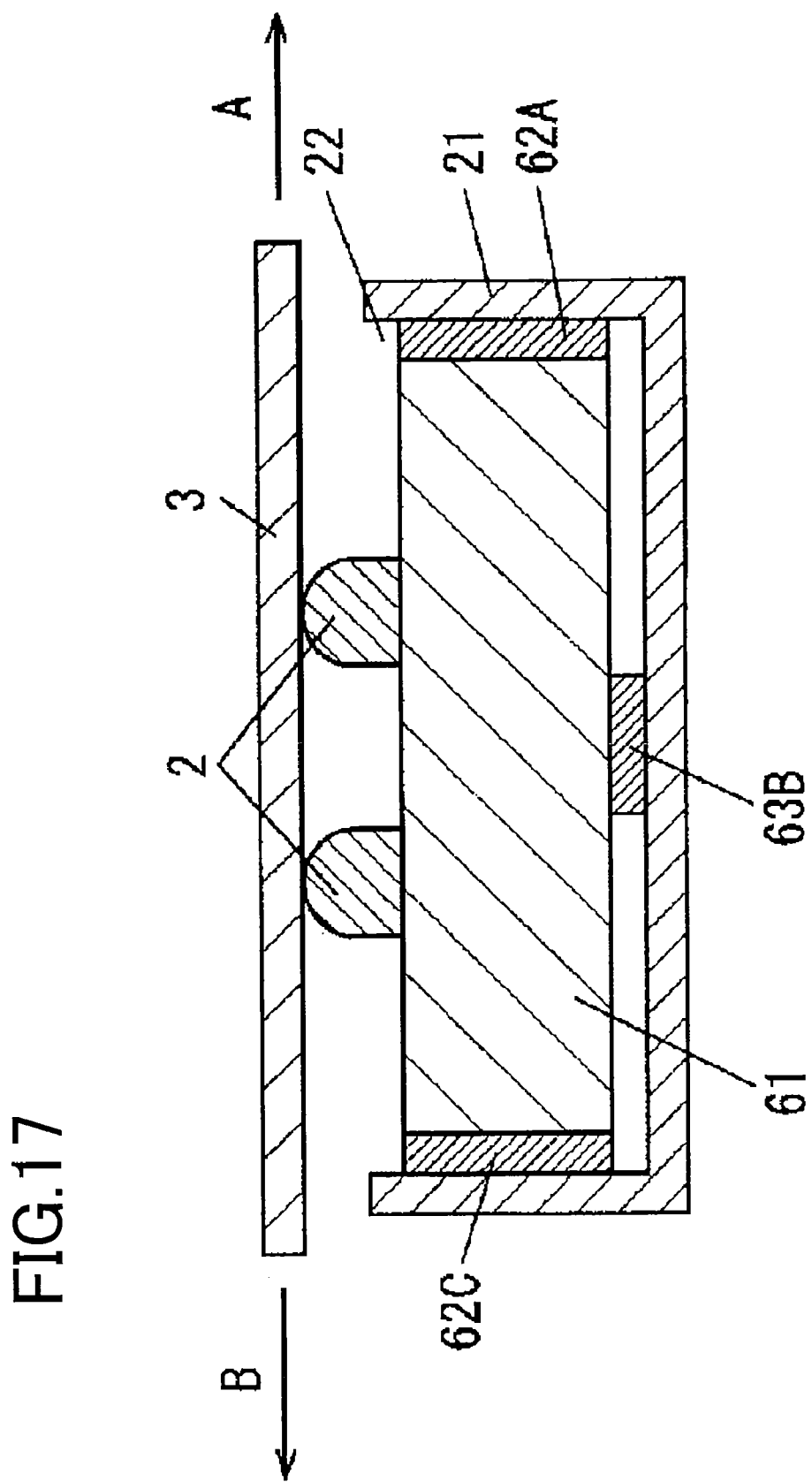
FIG. 17 is a sectional view of an ultrasonic actuator according to another reference embodiment.
Figure 18:
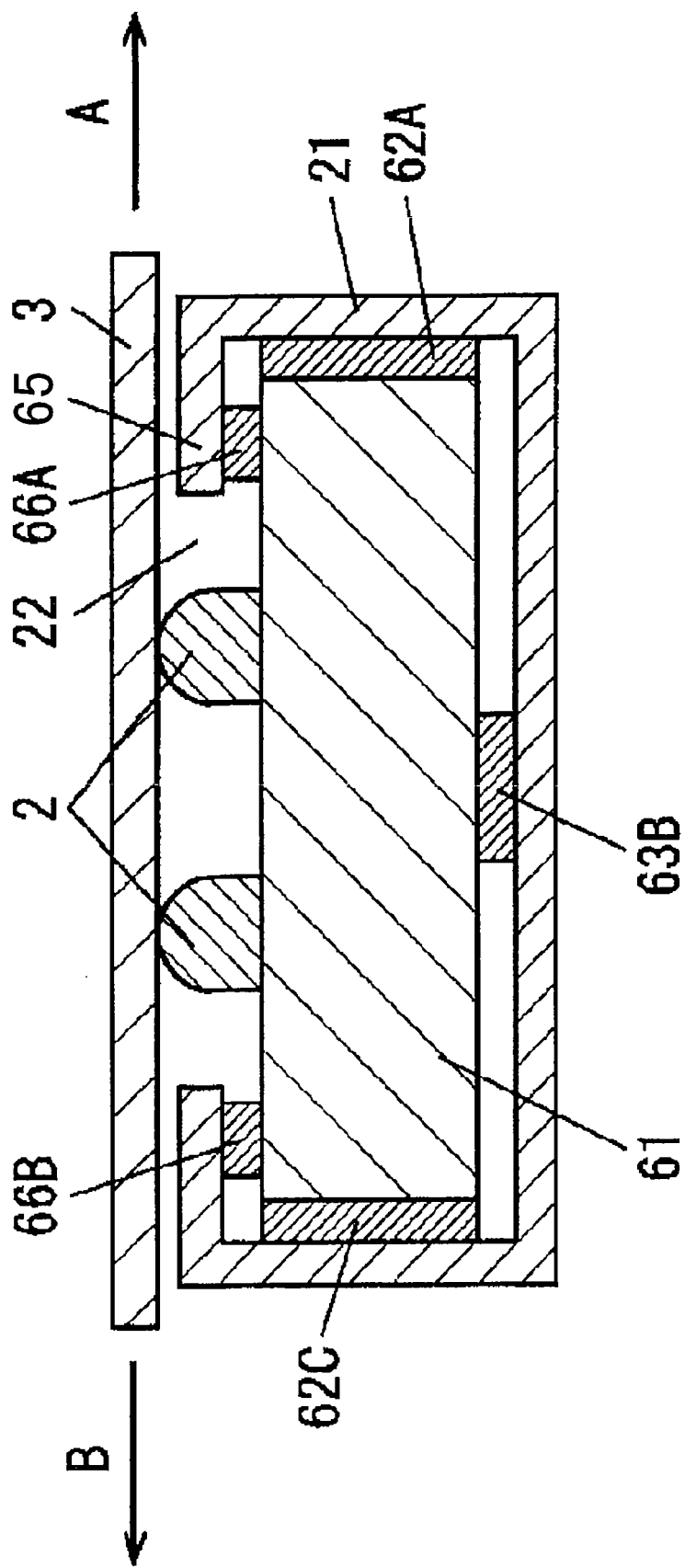
FIG. 18 is a sectional view of an ultrasonic actuator according to still another reference embodiment.

In the first and second embodiments described above, the piezoelectric elements 10 and 61 are supported by conductive rubber. However, only for the purpose of elastically supporting the piezoelectric elements 10 and 61, the structure shown in FIGS. 16 to 18 may be adopted. The structure of an ultrasonic actuator shown in FIG. 16 is basically the same as that of the second embodiment except that the supporting parts 52A, 53A and 54A for supporting the piezoelectric element 61 do not have the conductive parts. That is, the supporting parts 52A, 53A and 54A are made of an elastic body (e.g., an elastomer, silicone rubber or a leaf spring) but the elastic body is not conductive rubber. The structure of an ultrasonic actuator shown in FIG. 17 is basically the same as that of the first modification of the second embodiment except that the wall-surface supporting parts 62A and 62C and the bottom-surface supporting part 63B for supporting the piezoelectric element 61 do not have the conductive parts. That is, the wall-surface supporting parts 62A and 62C and the bottom-surface supporting part 63B are made of an elastic body (e.g., an elastomer, silicone rubber or a leaf spring) but the elastic body is not conductive rubber. The structure of an ultrasonic actuator shown in FIG. 18 is basically the same as that of the second modification of the second embodiment except that the wall-surface supporting parts 62A and 62C and the bottom-surface supporting part 63B for supporting the piezoelectric element 61 do not have the conductive parts. That is, the wall-surface supporting parts 62A and 62C and the bottom-surface supporting part 63B are made of an elastic body (e.g., an elastomer, silicone rubber or a leaf spring) but the elastic body is not conductive rubber.

With the above-described configuration, in particular when the silicone rubber is used, surface contact is established between the supporting parts and the piezoelectric element 61 and between the supporting parts and the supporting members. Therefore, the piezoelectric element 61 is supported with stability. Further, as compared with other elastomers, elasticity of the silicon rubber is less likely to vary with temperature change and therefore stable support is achieved. In addition, the occurrence of noise caused by the vibration of the piezoelectric element 61 is prevented.

With use of the elastic body at least as the supporting parts, the hindrance to the vibration of the piezoelectric element 61 is reduced. As a result, the efficiency of the ultrasonic actuator is improved. In particular, since the supporting parts 52A and 53A and the wall-surface supporting parts 62A and 62C support the piezoelectric element 61 at parts thereof other than the node (non-node parts), use of the elastic body has great effect of reducing the hindrance to a stretching vibration.

The supporting parts 6A, 6B, 7A and 7B of the first and second supporting members 6 and 7 support the nodes of the bending vibration and the bottom-surface supporting part 63B supports the node of the stretching and bending vibrations. Since the supporting parts 6A, 6B, 7A and 7B of the first and second supporting members 6 and 7 and the bottom-surface supporting part 63B are made of an elastic body, they are less likely to hinder the bending vibration. Although supporting parts 6A, 6B, 7A and 7B do not support the nodes of the stretching vibration, they are less likely to hinder the stretching vibration because they are made of the elastic body.

In view of recent demand for downsizing of the ultrasonic actuator, the piezoelectric element is also required to be downsized. If the piezoelectric element is downsized, it is more difficult to attach the supporting parts only to the nodes in terms of accuracy. However, with use of the elastic body as the supporting parts, the hindrance to the vibration is reduced even if the supporting parts are misaligned with the nodes to some extent. Therefore, in the manufacturing process, high accuracy is no longer necessary. This makes it possible to manufacture the small-sized ultrasonic actuator with ease.

For improved adhesion between the piezoelectric element and the elastic body, as well as between the supporting members and the elastic body, the elastic body is preferably mounted in a compressed state.

In some cases, the ultrasonic actuator is required not only to actuate the movable object 3, but also to actuate the movable object 3 with high positioning accuracy of the movable object 3. When the high positioning accuracy is required, the absolute position of the piezoelectric element 61, i.e., the position of the piezoelectric element with respect to the target device 1, is preferably controllable with high accuracy. As shown in FIGS. 16 to 18, in the ultrasonic actuators according to the reference embodiments, the driver elements 2 abut the movable object 3. Therefore, the movement of the piezoelectric element 61 in the direction orthogonal to the driving direction is restricted by the movable object 3, while the movement of the piezoelectric element 61 in the driving direction is relatively free from restraint. That is, it is necessary to support the piezoelectric element 61 with stability in the driving direction.

Thus, according to the reference embodiments, the piezoelectric element 61 is supported by the supporting parts 52A and 53A from both sides in the driving direction. By so doing, the piezoelectric element 61 is supported with higher stability as compared with the case where the piezoelectric element 61 is supported only by the supporting part 54A.

In the case where the piezoelectric element 61 is supported from both sides in the driving direction, when the lengthwise direction of the piezoelectric element 61 corresponds with the driving direction, both ends of the piezoelectric element 61 in the driving direction thereof are the non-node parts of the stretching vibration. Therefore, the stretching vibration may possibly be hindered. Therefore, according to the reference embodiments, the supporting parts 52A and 53A supporting the both ends of the piezoelectric element 61 in the driving direction are made of an elastic body. Specifically, even if the both ends of the piezoelectric element 61 in the driving direction are the non-node parts of the vibration, the vibration is not hindered and the piezoelectric element 61 is supported with stability. As a result, the ultrasonic actuator is obtained with high positioning accuracy.

Instead of supporting the piezoelectric element 61 on the side surfaces as described in the present embodiments, the piezoelectric element 61 may be supported by using a rod member penetrating the piezoelectric element 61 in the thickness direction. However, the structure of the present embodiments is superior to the structure including the rod for supporting the piezoelectric element 61 because the dimension of the piezoelectric element 61 in the thickness direction is reduced and the ultrasonic actuator is made compact in size.

The feeding electrodes 8 are provided on the front surface of the piezoelectric element 61 and wires 4 are connected to the feeding electrodes 8 of the piezoelectric element 61 via solders 5. When a voltage is applied to the feeding electrodes 8 of the piezoelectric element 61 via the wires 4, the piezoelectric element 61 vibrates in accordance with the frequency of the applied voltage.

To be more specific, the piezoelectric element 61 made of piezoelectric ceramic material based on lead titanate zirconate is sized to have a length of 6 mm, a width of 1.7 mm and a thickness of 1 mm. The electrodes are provided as shown in FIG. 16. When polarization in the thickness direction is performed, the resonance frequencies of the first-order mode of stretching vibration and the second-order mode of bending vibration are almost equal around 270 kHz.

A wire 4g connected to an electrode formed on the almost entire area of the rear surface of the piezoelectric element 61 is connected to ground. Then, a sinusoidal reference voltage of 270 kHz, 20 Vrms is applied to the wire 4a connected to the electrodes 8a and 8c, while a voltage having the same frequency, the same voltage value and a phase shifted by 90° or −90° is applied to the wire 4b connected to the electrodes 8b to 8d. Thus, the piezoelectric element 61 is induced to vibrate in the second-order mode of bending vibration and the first-order mode of stretching vibration in a harmonious manner. As a result, the shape of the piezoelectric element 61 varies sequentially in the order shown in FIGS. 11A to 11D and the driver elements 2 make a substantially elliptical motion.

The solders 5 are formed on part of the piezoelectric element 61 near the node of the stretching and bending vibrations. As the wires 4 are connected at the node, adverse effect on the vibrations of the piezoelectric element 61, i.e., unwanted load applied to the piezoelectric element 61 by the formation of the solders 5, is reduced as much as possible.

Other Embodiments

Figure 19:
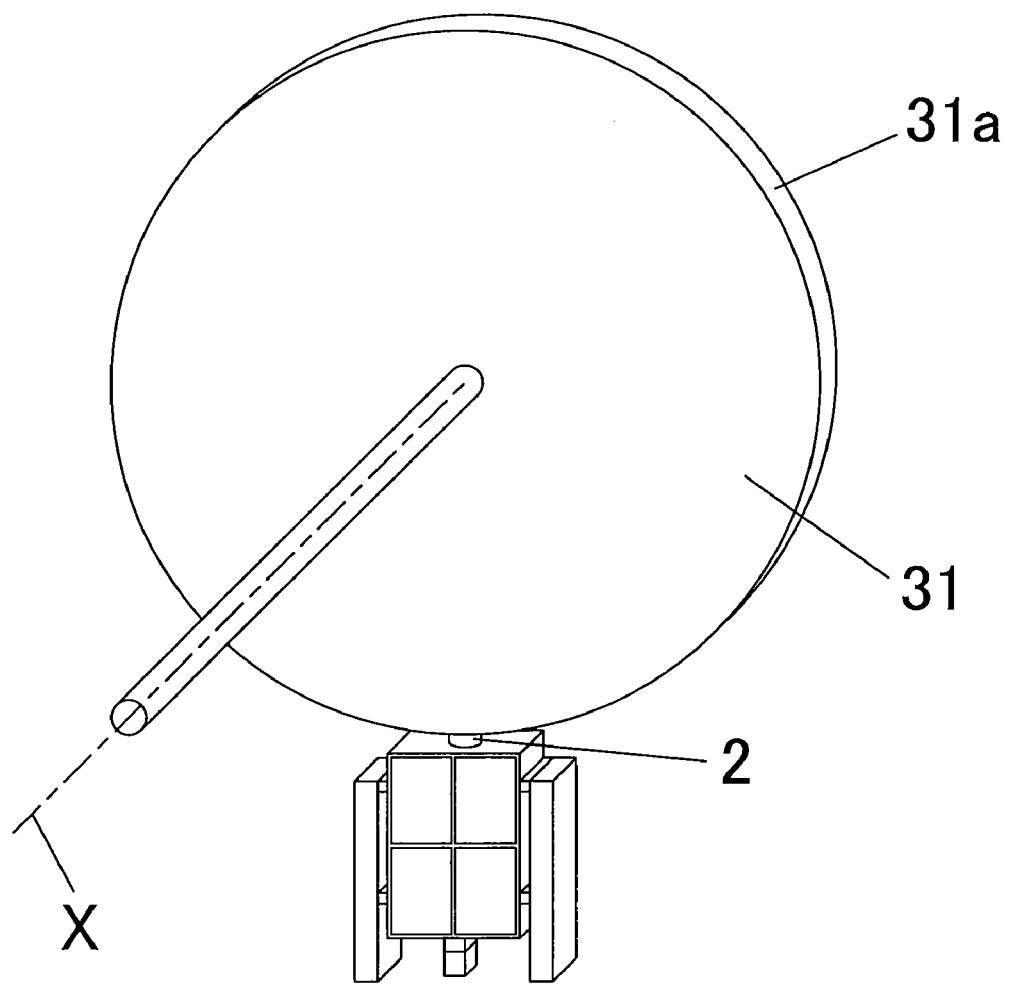
FIG. 19 is a perspective view of an ultrasonic actuator according to another embodiment.
Figure 20:
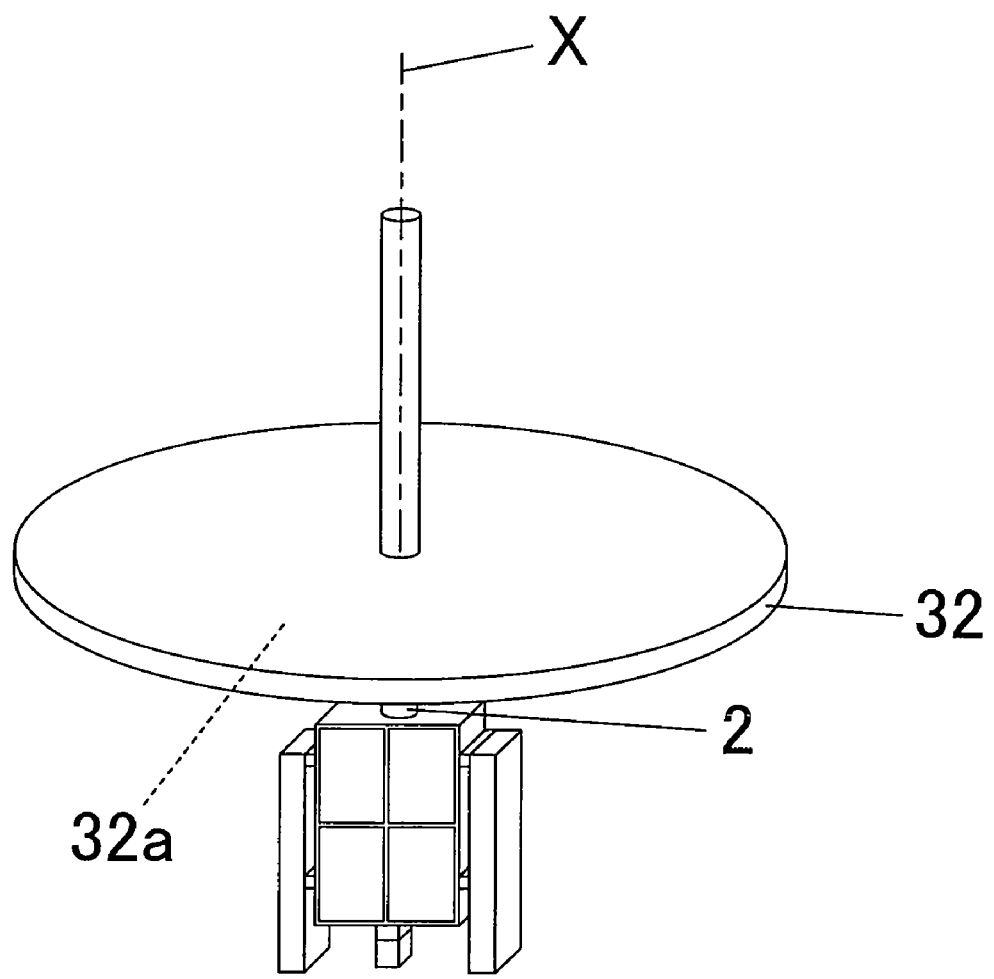
FIG. 20 is a perspective view of an ultrasonic actuator according to still another embodiment.
Figure 21:
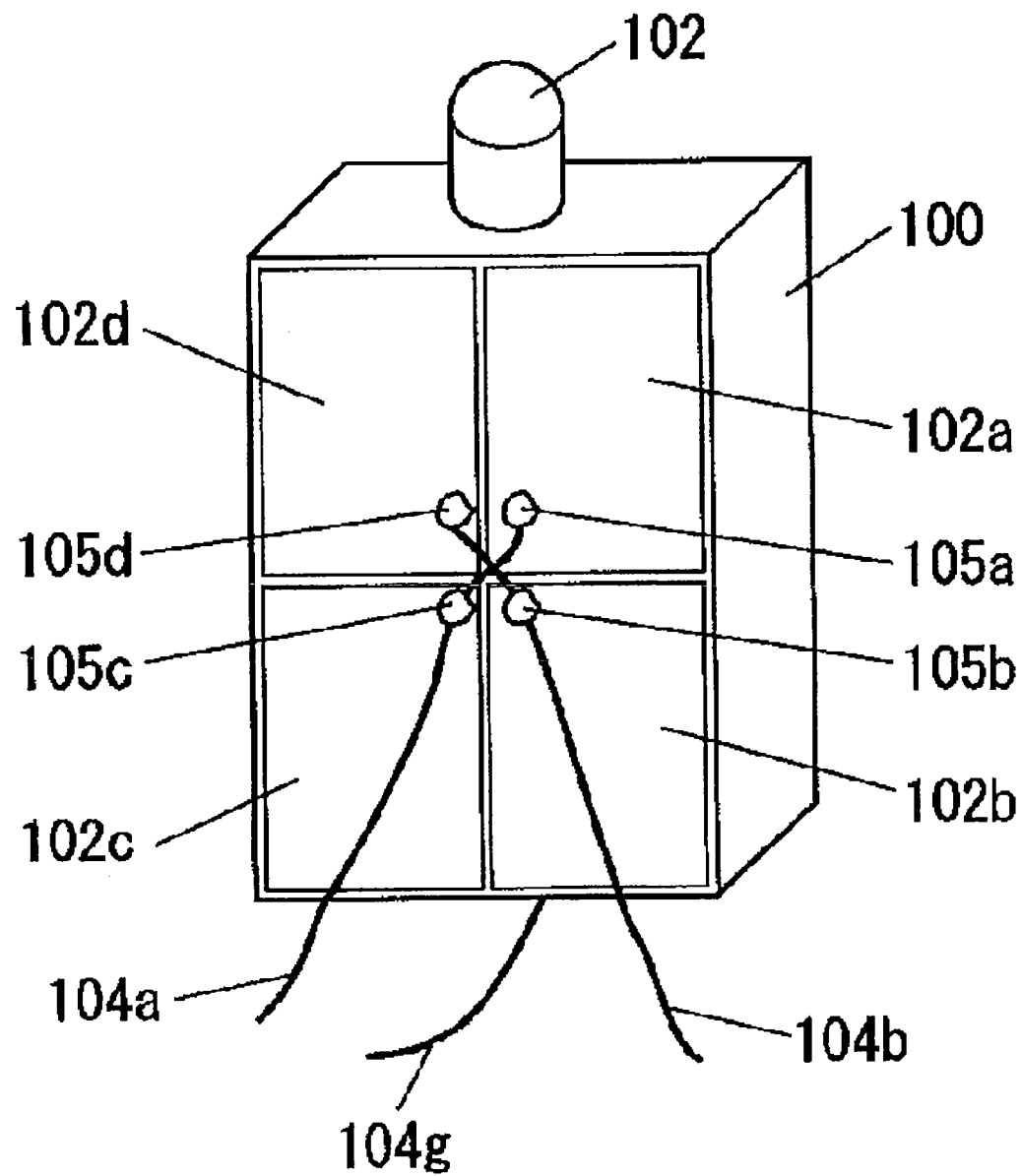
FIG. 21 is a perspective view of a piezoelectric element of a conventional ultrasonic actuator.
Figure 22:
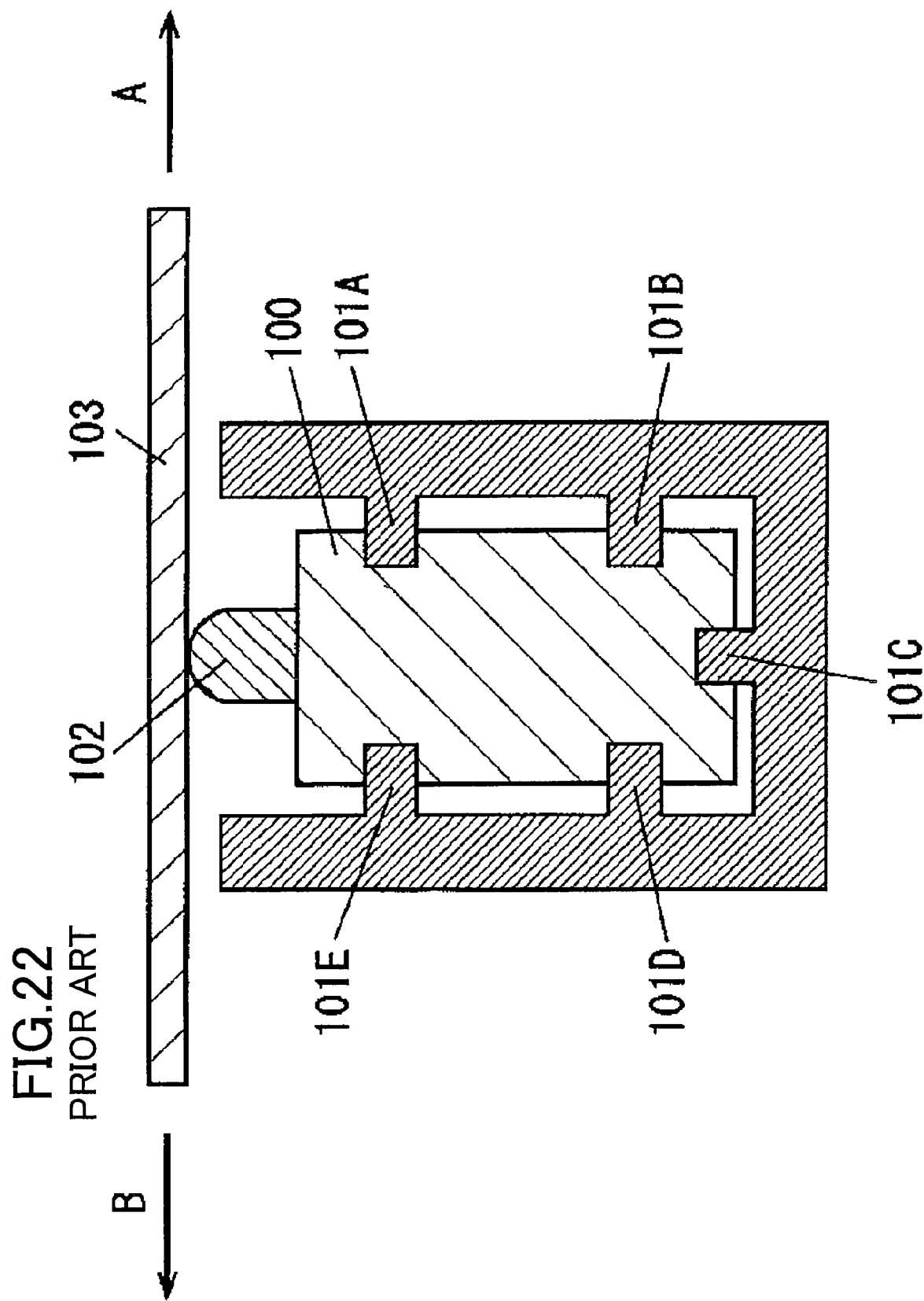
FIG. 22 is a sectional view of the conventional ultrasonic actuator.

In the above-described embodiments, the movable object 3 to be actuated upon application of the driving force of the ultrasonic actuator is in the form of a plate. However, the shape of the movable object is not limited thereto and may optionally be varied as needed. For example, as shown in FIG. 19, the movable object may be configured as a disc 31 capable of rotating about an axis X and the driver elements 2 of the ultrasonic actuator may be configured to abut an outer edge surface 31a of the disc 31. In such a case, when the ultrasonic actuator is turned on, the disc 31 rotates about the axis X in response to the substantially elliptical motion of the driver elements 2. Further, as shown in FIG. 20, the movable object may be configured as a disc 32 capable of rotating about an axis X and the driver elements 2 of the ultrasonic actuator may be configured to abut a flat surface 32a of the disc 32. In such a case, when the ultrasonic actuator is turned on, the disc 32 is actuated in the direction of a tangent line at the contact point with the driver elements 2 due to the substantially elliptical motion of the driver elements 2. As a result, the disc 32 is rotated about the axis X.

In the embodiments of the present invention, only the first-order mode of stretching vibration and the second-order mode of bending vibration are mentioned. However, other vibration modes such as a first-order mode of stretching vibration, a fourth-order mode of bending vibration and longitudinal-torsional vibration may also be applicable.

The supporting members, the wall-surface supporting parts and the bottom-surface supporting parts described above are all made of an elastic body. However, the same effect is obtained even if at least one of them is made of the elastic body. Or alternatively, only a single annular supporting part surrounding the piezoelectric element is provided and part of the annular supporting part in contact with the piezoelectric element is made of the elastic body.

In the above-described embodiments, the feeding electrodes 8 are formed on the front and rear surfaces of the piezoelectric element to achieve a single-panel piezoelectric element. However, the electrodes and the piezoelectric body may be configured as a layered structure. In such a case, a voltage is applied to an outer electrode formed on a certain surface of the piezoelectric element and connected to a plurality of internal electrodes such that the elliptical motion of the driver elements takes place.

The feeding electrodes according to the present embodiments are four quadrant electrodes formed on the front surface and the electrode formed on the almost entire area of the rear surface. However, for example, even if the electrodes divided in two or five are used, the same effect is obtained.

In the above description, the elliptical motion of the driver element is caused by using the piezoelectric element only. However, even if a resonator including the piezoelectric element bonded thereto or incorporated therein is used, the same effect is obtained. In such a case, the resonator including the piezoelectric element constitutes an actuator body.

The above-described embodiments are only for illustration of preferred examples of the present invention and do not limit the scope of the present invention, the subject of the invention and the scope of the application of the invention.

INDUSTRIAL APPLICABILITY

The ultrasonic actuator according to the present invention uses an elastic body as the supporting member for the piezoelectric element and achieves improvement in efficiency and reduction in size. Thus, the present invention is useful for electrical devices that require improvement in efficiency and reduction in size.

The invention claimed is:

1. An ultrasonic actuator comprising:
   an actuator body including a piezoelectric element in a whole or in a part and generating vibrations having different vibration directions;
   a driver element provided on the actuator body and actuated in accordance with the vibration of the actuator body, thereby producing a driving force toward a certain driving direction;
   a feeding electrode provided on the actuator body and electrically connected to the piezoelectric element; and
   a feeding-supporting portion provided in contact with the feeding electrode to elastically support the actuator body from both sides in the driving direction and serving as a feeding terminal for supplying a voltage to the feeding electrode.

2. The ultrasonic actuator of claim 1, wherein the feeding-supporting portion is conductive rubber.

3. The ultrasonic actuator of claim 1, wherein the actuator body generates at least a bending vibration and a longitudinal vibration in combination.

4. The ultrasonic actuator of claim 1, wherein the driving direction is the same as the vibration direction of the longitudinal vibration of the actuator body.

5. The ultrasonic actuator of claim 1, wherein the feeding-supporting portion supports a non-node portion of the actuator body in the longitudinal vibration.

6. The ultrasonic actuator of claim 2, wherein the conductive rubber is mounted in a compressed state.

7. The ultrasonic actuator of claim 2, wherein base material of the conductive rubber is silicone rubber.

8. The ultrasonic actuator of claim 7, wherein the conductive rubber is compressed to a compressibility of 5 to 40%.

9. The ultrasonic actuator of claim 2 further comprising:
   a supporting member having a lead electrode for supplying a voltage to the piezoelectric element, wherein
   the feeding-supporting portion elastically supports the actuator body on the support member and electrically connects the lead electrode to the feeding electrode.

10. The ultrasonic actuator of claim 2, wherein the conductive rubber includes at least one of a metallic wire and metallic particles.

11. The ultrasonic actuator of claim 2, wherein the feeding electrode contains silver as a major or material and
the conductive rubber contains silver.

12. The ultrasonic actuator of claim 1, further comprising:
a bottom-surface supporting portion for supporting the actuator body abutting a surface of the actuator body opposed to the surface of the actuator body on which the driver element is provided.

13. The ultrasonic actuator of claim 12, wherein
the bottom-surface supporting portion is at least partially made of an elastic body.

14. The ultrasonic actuator of claim 13, wherein
the elastic body is mounted in a compressed state.

15. The ultrasonic actuator of claim 14, wherein
a plurality of driver elements are provided on the same surface of the actuator body and
the bottom-surface supporting portion is provided on the opposed surface of the actuator body onto which the center of gravity of the plurality of driver elements is projected.

16. The ultrasonic actuator of claim 13, wherein
the elastic body is silicone rubber.

17. The ultrasonic actuator of claim 13 further comprising:
an additional feeding electrode provided on an opposed surface provided on the opposed surface of the actuator body and electrically connected to the piezoelectric element, wherein
the elastic body is conductive rubber serving as a feeding terminal for supplying a voltage to the feeding electrode of the opposed surface.

18. The ultrasonic actuator of claim 17, wherein
base material of the conductive rubber is silicone rubber and the conductive rubber is compressed to a compressibility of 5 to 40%.

19. The ultrasonic actuator of claim 17 further comprising:
a supporting member having a lead electrode for supplying a voltage to the piezoelectric element, wherein
the bottom-surface supporting portion abuts the feeding electrode of the opposed surface to elastically support the actuator body on the supporting member and electrically connect the lead electrode to the feeding electrode of the opposed surface.

20. The ultrasonic actuator of claim 17, wherein the conductive rubber includes at least one of a metallic wire and metallic particles.

21. The ultrasonic actuator of claim 17, wherein
the additional feeding electrode contains silver as a major material and the conductive rubber contains silver.

* * * * *